(12) United States Patent
Wong

(10) Patent No.: US 11,201,222 B2
(45) Date of Patent: Dec. 14, 2021

(54) SEMICONDUCTOR DEVICE AND FABRICATION METHOD THEREOF

(71) Applicant: INNOSCIENCE (ZHUHAI) TECHNOLOGY CO., LTD., Zhuhai (CN)

(72) Inventor: King Yuen Wong, Zhuhai (CN)

(73) Assignee: Innoscience (Zhuhai) Technology Co., Ltd., Zhuhai (CN)

( * ) Notice: Subject to any disclaimer, the term of this patent is extended or adjusted under 35 U.S.C. 154(b) by 0 days.

(21) Appl. No.: 16/771,670

(22) PCT Filed: Mar. 25, 2020

(86) PCT No.: PCT/CN2020/081115
§ 371 (c)(1),
(2) Date: Jun. 10, 2020

(87) PCT Pub. No.: WO2020/192689
PCT Pub. Date: Oct. 1, 2020

(65) Prior Publication Data
US 2021/0257475 A1    Aug. 19, 2021

(30) Foreign Application Priority Data

Mar. 28, 2019 (CN) .......................... 201910245261.2

(51) Int. Cl.
*H01L 29/423* (2006.01)
*H01L 21/285* (2006.01)
(Continued)

(52) U.S. Cl.
CPC .. *H01L 29/42316* (2013.01); *H01L 21/28587* (2013.01); *H01L 29/2003* (2013.01);
(Continued)

(58) Field of Classification Search
CPC ......... H01L 29/42316; H01L 29/66462; H01L 29/7786; H01L 29/401; H01L 21/28587
See application file for complete search history.

(56) References Cited

U.S. PATENT DOCUMENTS

2006/0019435 A1*  1/2006  Sheppard ............ H01L 29/7786
                                                              438/167
2007/0278518 A1* 12/2007  Chen .................... H01L 29/7787
                                                              257/192
(Continued)

FOREIGN PATENT DOCUMENTS

CN         1175086 A       3/1998
CN       103426914 A      12/2013
(Continued)

OTHER PUBLICATIONS

Chang Hudong et al. (CN publication 108461543 A, English machine translation) (Year: 2018).*
(Continued)

*Primary Examiner* — Mohammed R Alam
(74) *Attorney, Agent, or Firm* — Idea Intellectual Limited; Margaret A. Burke; Sam T. Yip

(57) ABSTRACT

The present disclosure provides a semiconductor device and a fabrication method thereof. The semiconductor device includes a substrate, a barrier layer disposed above the substrate, and a dielectric layer disposed on the barrier layer and defining a first recess. The semiconductor device further includes a spacer disposed within the first recess and a gate disposed between a first portion of the spacer and a second portion of the spacer, wherein the gate defining a first recess.

25 Claims, 24 Drawing Sheets

(51) Int. Cl.
*H01L 29/40* (2006.01)
*H01L 29/66* (2006.01)
*H01L 29/778* (2006.01)
*H01L 29/20* (2006.01)
*H01L 29/205* (2006.01)

(52) U.S. Cl.
CPC .......... *H01L 29/205* (2013.01); *H01L 29/401* (2013.01); *H01L 29/66462* (2013.01); *H01L 29/7786* (2013.01)

(56) References Cited

U.S. PATENT DOCUMENTS

| | | | | |
|---|---|---|---|---|
| 2012/0261720 | A1* | 10/2012 | Puglisi | H01L 29/7787 257/194 |
| 2014/0054598 | A1* | 2/2014 | Shim | H01L 29/66431 257/76 |
| 2014/0092637 | A1* | 4/2014 | Minoura | H01L 23/3171 363/17 |
| 2014/0231823 | A1* | 8/2014 | Chowdhury | H01L 29/205 257/76 |
| 2014/0264713 | A1 | 9/2014 | Radulescu et al. | |
| 2015/0325650 | A1 | 11/2015 | Basu et al. | |

FOREIGN PATENT DOCUMENTS

| | | |
|---|---|---|
| CN | 107170809 A | 9/2017 |
| CN | 108461543 A | 8/2018 |
| CN | 109841677 A | 6/2019 |

OTHER PUBLICATIONS

First Office Action of the corresponding China patent application No. 202080000989.X dated Feb. 26, 2021.

International Search Report & Written Opinion of corresponding PCT Patent Application No. PCT/CN2020/081115 dated Jul. 1, 2020.

* cited by examiner

SEMICONDUCTOR DEVICE AND FABRICATION METHOD THEREOF

BACKGROUND

1. Technical Field

The present disclosure relates to a semiconductor device, and more particularly to a high electron mobility semiconductor device and a fabrication method thereof.

2. Description of the Related Art

A high electron mobility transistor (HEMT) is a kind of field effect transistor. Unlike metal oxide semiconductor (MOS) field-effect transistors, the HEMT uses two materials with different energy gaps to form a heterojunction. The polarization of heterojunction forms a two-dimensional electron gas (2DEG) region in the channel layer, providing a channel for carriers. The HEMT attracts a lot of attention because of its high frequency characteristics. Because it can work at high frequencies, it is widely used in various radio frequency (RF) devices or mobile devices.

In the RF applications, the gate profile of a HEMT may affect the frequency characteristics and/or performance of the HEMT. In order to manufacture a HEMT that has a desired gate profile, machines having specific precision requirements may be necessary and thus may result in high manufacturing costs. Therefore, there is a need to provide a semiconductor device and a fabrication method thereof to resolve the above issue.

SUMMARY OF THE INVENTION

In some embodiments of the present disclosure, a semiconductor device is provided. The semiconductor device includes a substrate, a barrier layer disposed above the substrate, and a dielectric layer disposed on the barrier layer and defining a first recess. The semiconductor device further includes a spacer disposed within the first recess and a gate disposed between a first portion of the spacer and a second portion of the spacer, wherein the gate defining a first recess.

In some embodiments of the present disclosure, a semiconductor structure is provided. The semiconductor structure includes a substrate and a barrier layer disposed above the substrate. The semiconductor structure further includes a dielectric layer disposed on the barrier layer and defining a first recess. The semiconductor structure further includes a gate disposed within the first recess, wherein a first portion of the gate is laterally spaced apart from the dielectric layer.

In some embodiments of the present disclosure, a method for fabricating a semiconductor device is provided. The method includes providing a semiconductor structure having a substrate, a barrier layer and a first dielectric layer, forming a first opening having a first length on the first dielectric layer, forming a second dielectric layer on the first dielectric layer, and removing a portion of the second dielectric layer, so as to form a first spacer and a second spacer within the first opening, wherein the smallest distance between the first spacer and the second spacer is smaller than the first length.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

PREFERRED EMBODIMENT OF THE PRESENT INVENTION

Figure 1A:
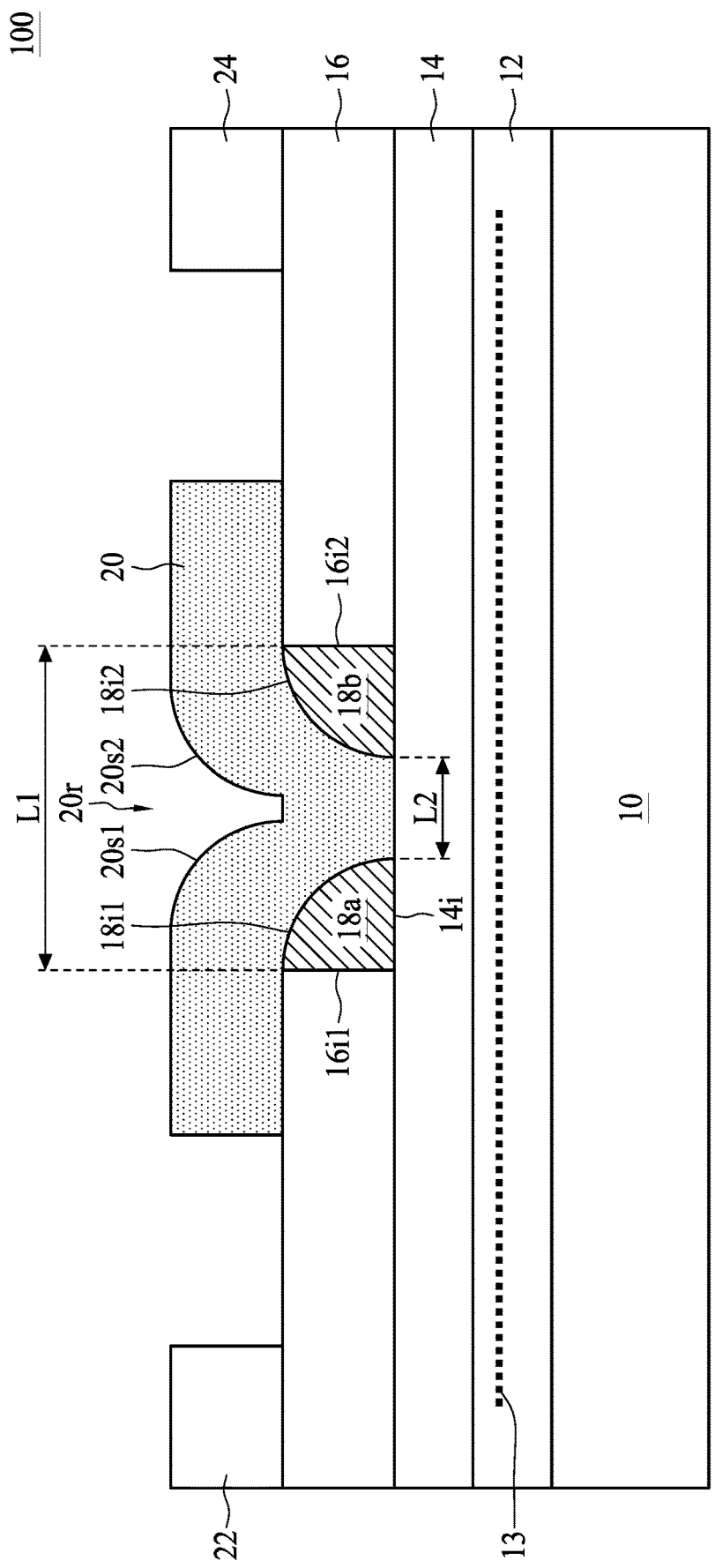
FIG. 1A is a simplified schematic cross-sectional view of a portion of a semiconductor structure according to certain embodiments of the present disclosure.

The following disclosure provides many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

In field effect transistors (FETs), depletion mode (D-mode) and enhancement mode (E-mode) are two major transistor types, corresponding to whether the transistor is in an ON state or an OFF state at zero gate bias voltage.

A depletion mode HEMT is conductive at zero gate bias voltage, due to the polarization-induced charge at the barrier/channel interface, and is also known as depletion HEMT, or dHEMT. A dHEMT is a normally-on device and is suitable for applications involving, for example, radio communications, radio frequency (RF) devices, RF power amplifiers, and/or microwave devices.

A HEMT made of semiconductor hetero-interfaces lacking interfacial net polarization charge (such as AlGaAs/GaAs), requires positive gate voltage or appropriate donor-doping in the AlGaAs barrier to attract the electrons towards the gate, which forms the 2D electron gas and enables conduction of electron currents. This behavior is similar to that of commonly used field-effect transistors in the E-mode, and such a device is called enhancement HEMT, or eHEMT. An eHEMT is a normally-off device and is suitable for applications involving, for example, power controlling and circuit controlling.

FIG. 1A is a simplified schematic cross-sectional view of a portion of a semiconductor structure according to certain embodiments of the present disclosure.

FIG. 1A shows a semiconductor structure 100 according to certain embodiments of the present disclosure. The semiconductor structure 100 can also be referred to as a semiconductor device or a semiconductor apparatus.

As shown in FIG. 1A, the semiconductor structure 100 includes a substrate 10, a channel layer 12, a barrier layer 14, a dielectric layer 16, a gate 20, a drain 22 and a source 24. The semiconductor structure 100 further includes spacers 18a and 18b.

The substrate 10 may include, without limitation, silicon (Si), doped Si, silicon carbide (SiC), germanium silicide (SiGe), gallium arsenide (GaAs), or other semiconductor materials. The substrate 10 may include, without limitation, sapphire, silicon on insulator (SOI), or other suitable materials. In some embodiments, the substrate 10 may further include a doped region (not shown in FIG. 1A), for example, a p-well, n-well, or the like.

The channel layer 12 can be disposed on the substrate 10. The channel layer 12 may contain, for example, but is not limited to, group III nitrides, such as compound $Al_yGa_{(1-y)}N$, where y≤1. In some embodiments, the channel layer 12 may include GaN.

In some embodiments, the channel layer 12 may include undoped GaN. In some embodiments, the channel layer 12 may include doped GaN.

The barrier layer 14 can be disposed on the channel layer 12. The barrier layer 14 may contain, for example, but is not limited to, group III nitrides, such as compound $Al_yGa_{(1-y)}N$, where y≤1. The barrier layer 14 may have a relatively larger bandgap than the channel layer 12. In some embodiments, the barrier layer 14 may include AlGaN. In some embodiments, the barrier layer 14 may include undoped AlGaN. In some embodiments, the barrier layer 14 may include doped AlGaN.

The channel layer 12 and the barrier layer 14 may include, without limitation, for example, a p-type dopant, an n-type dopant, or other dopants. In some embodiments, exemplary dopants can include, for example, but are not limited to, magnesium (Mg), zinc (Zn), cadmium (Cd), silicon (Si), germanium (Ge), and the like.

Heterojunction can be formed between the channel layer 12 and the barrier layer 14. The polarization resulting from the heterojunction between different nitrogen compounds forms a 2DEG region 13. In some embodiments, the 2DEG region 13 is formed within the channel layer 12. In some embodiments, the 2DEG region 13 is formed adjacent to the interface between the channel layer 12 and the barrier layer 14. In some embodiments, the 2DEG region 13 is formed in a layer with a small band gap (e.g. GaN).

The channel layer 12 can supply electrons to the 2DEG region. The channel layer 12 can remove electrons from the 2DEG region. The channel layer 12 can control the conduction of the semiconductor structure 100 with high electron mobility.

The dielectric layer 16 can be disposed on the barrier layer 14. In some embodiments, the dielectric layer 16 may include a multi-layered structure. In some embodiments, the dielectric layer 16 may include several stacked dielectric layers of different materials.

The dielectric layer 16 may include, without limitation, for example, an oxide or a nitride, such as silicon nitride (SiN), silicon oxide (SiO2), and the like. The dielectric layer 16 may include, for example, without limitation, a composite layer of an oxide and a nitride, such as $Al_2O_3/SiN$, $Al_2O_3/SiO_2$, AlN/SiN, $AlN/SiO_2$, and the like.

The spacers 18a and 18b can be disposed within a recess of the dielectric layer 16. The spacers 18a and 18b may include dielectric materials. The spacers 18a and 18b may include, without limitation, for example, an oxide or a nitride, such as silicon nitride (SiN), silicon oxide ($SiO_2$), and the like. The spacers 18a and 18b may include, for example, without limitation, a composite layer of an oxide and a nitride, such as Al2O3/SiN, Al2O3/SiO2, AlN/SiN, $AlN/SiO_2$, and the like.

In some embodiments, the spacers 18a and 18b may include materials identical to those of the dielectric layer 16. In some embodiments, the spacer 18a may be referred to as a part of the dielectric layer 16. In some embodiments, the spacer 18b may be referred to as a part of the dielectric layer 16. In some embodiments, the spacers 18a and 18b may include materials different from those of the dielectric layer 16.

Figure 3A:
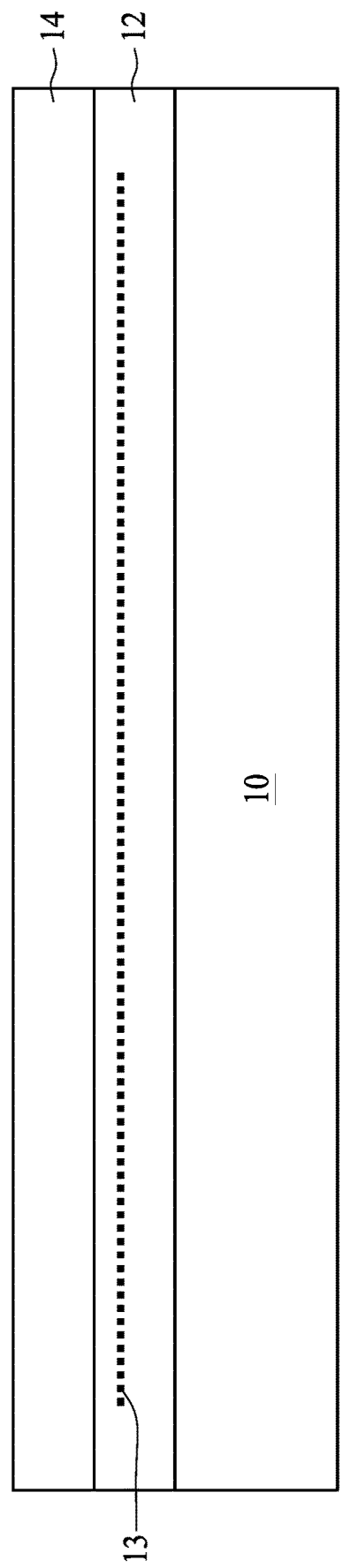
FIG. 3A, FIG. 3B, FIG. 3C, FIG. 3D and FIG. 3E illustrate a method of manufacturing a semiconductor structure according to some embodiments of the present disclosure.
Figure 3B:
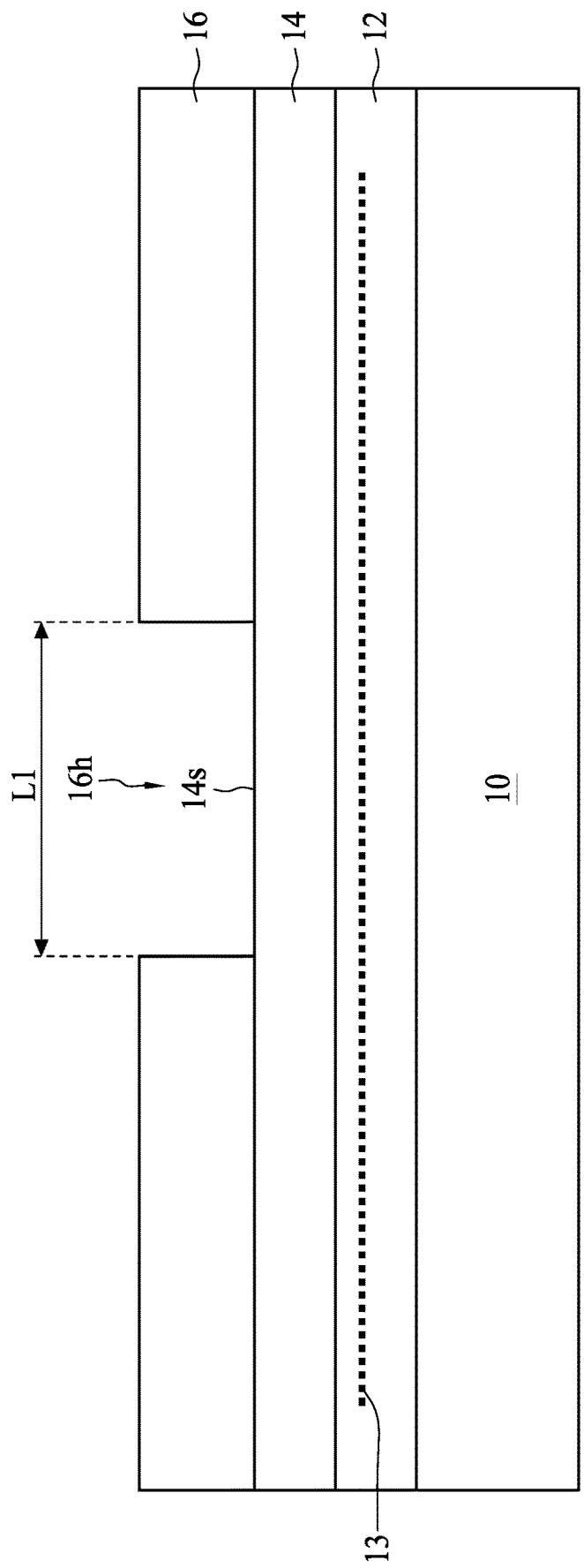
Figure 3C:
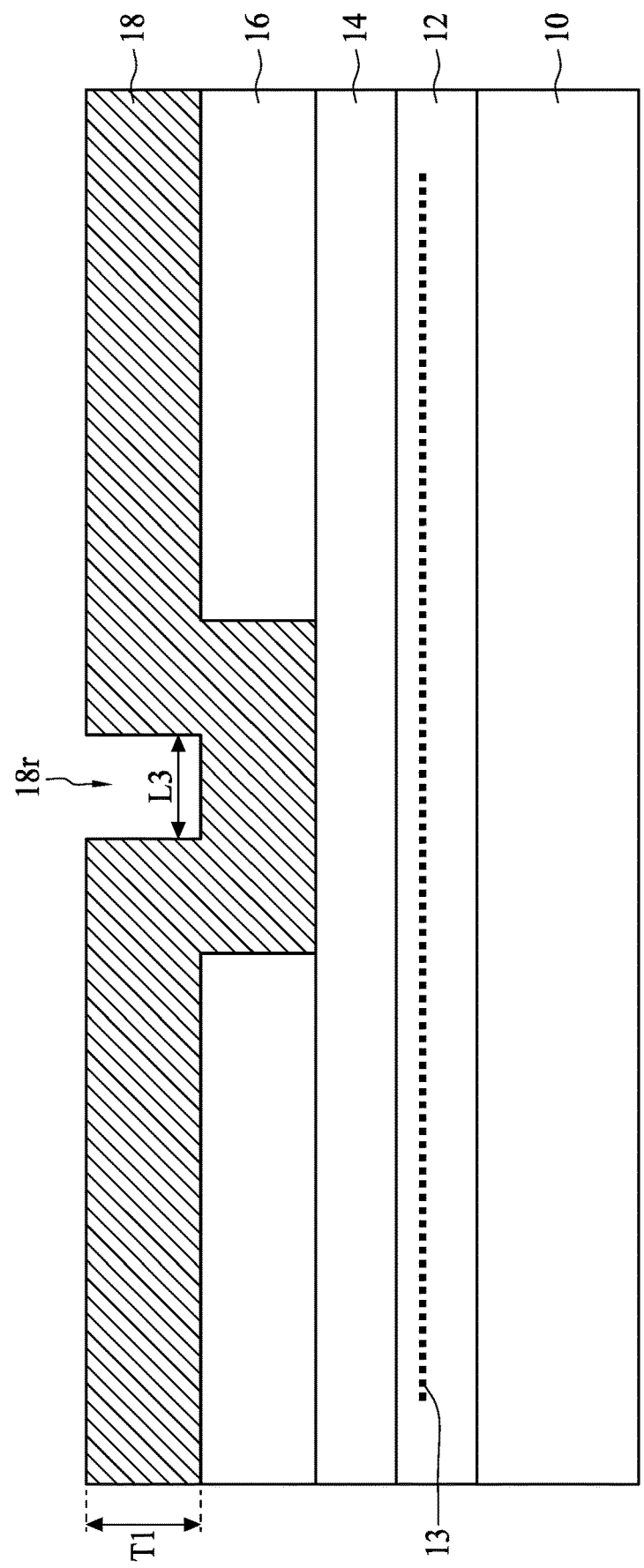
Figure 3D:
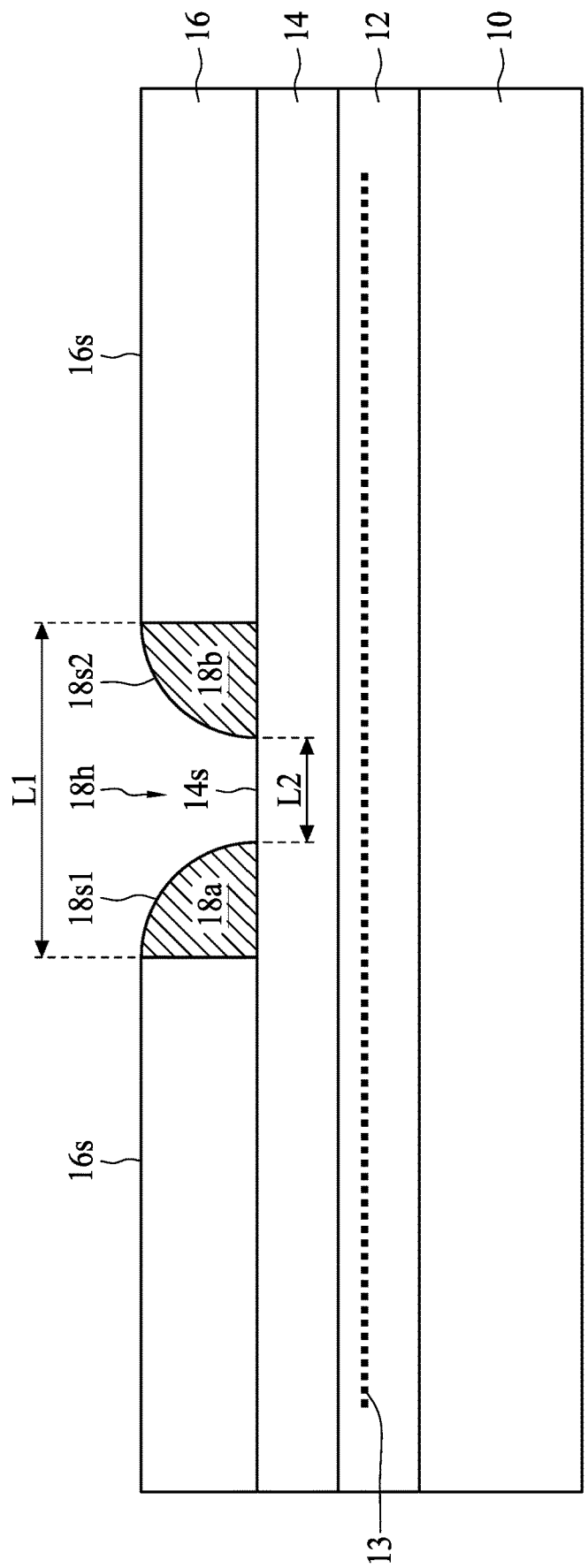
Figure 3E:
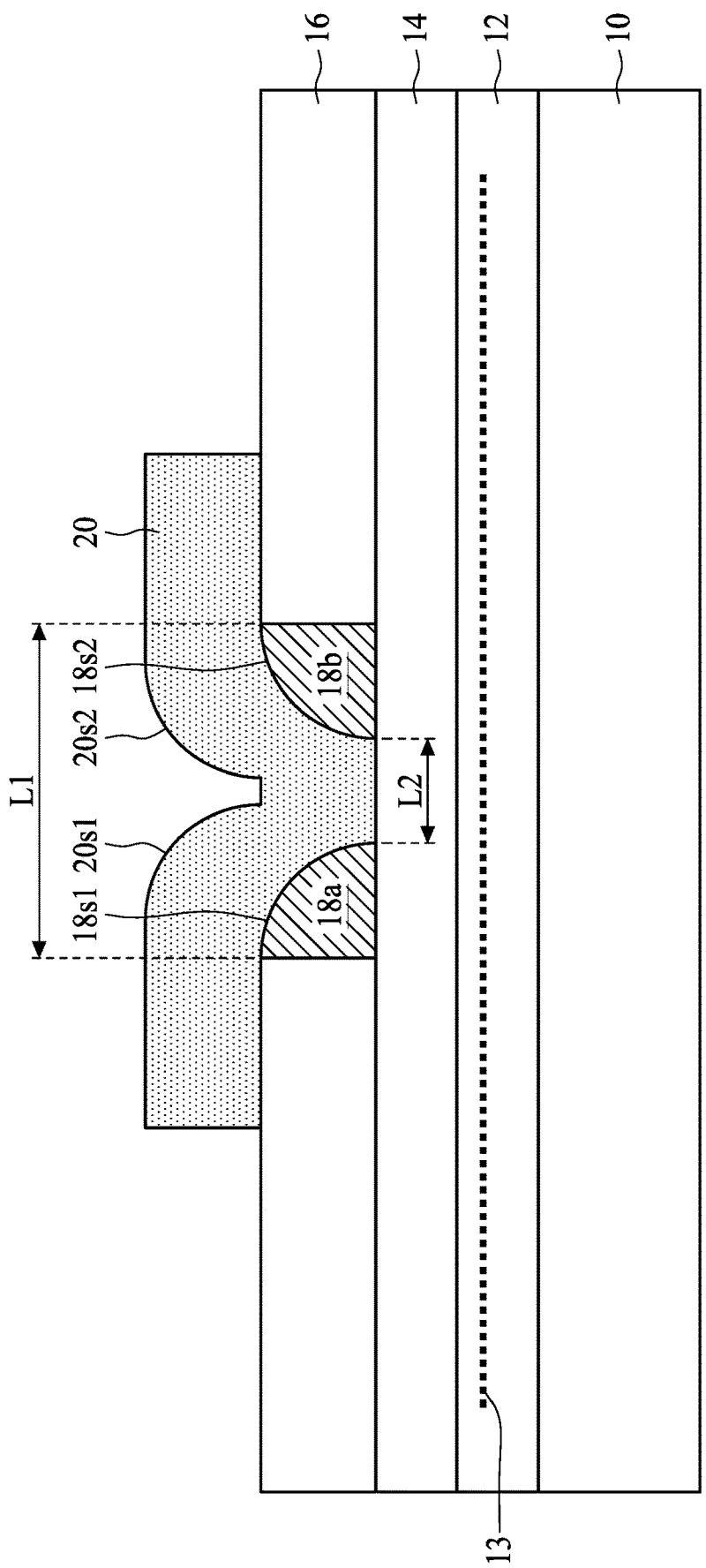
Figure 3F:
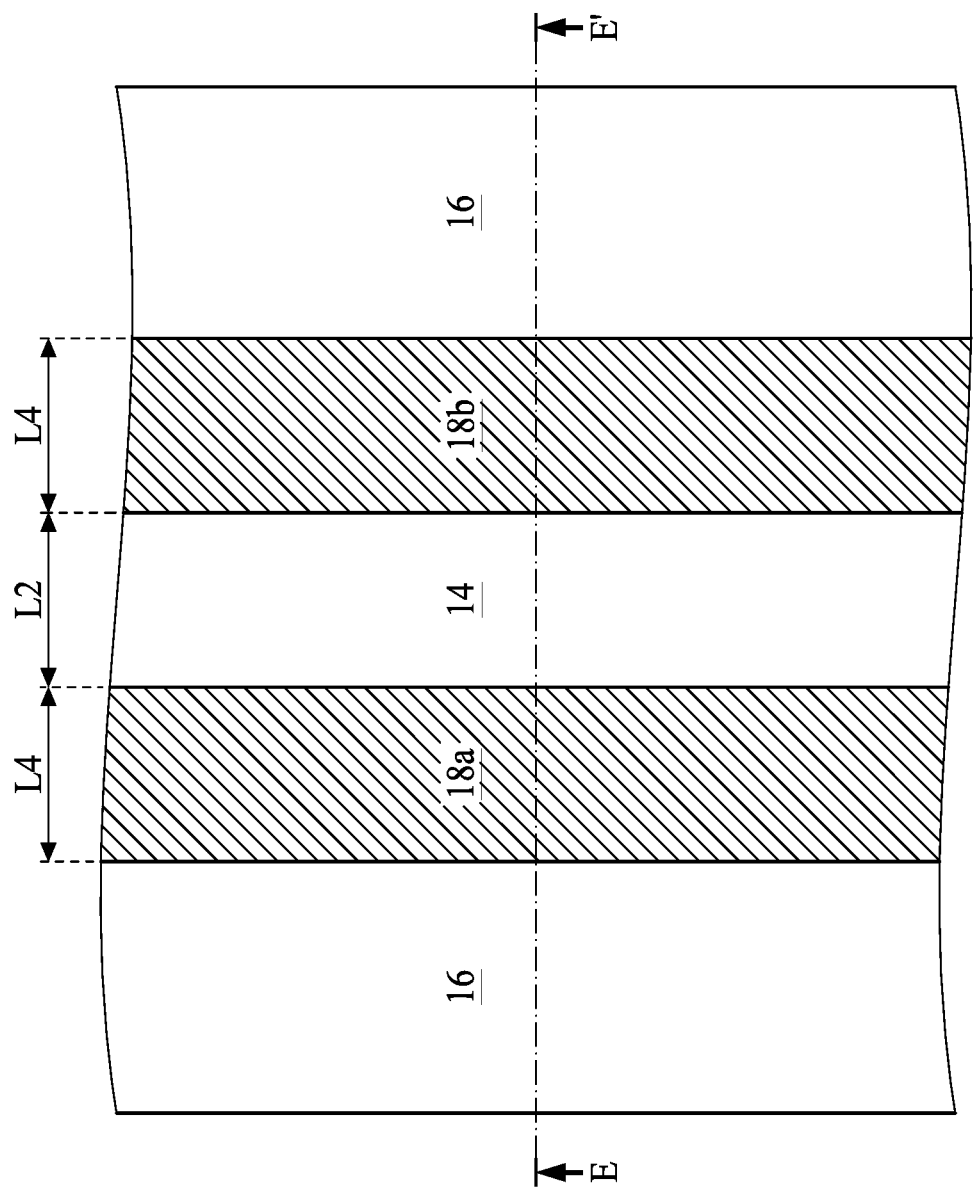
FIG. 3F is a top view of a portion of a semiconductor structure according to certain embodiments of the present disclosure.
Figure 3G:
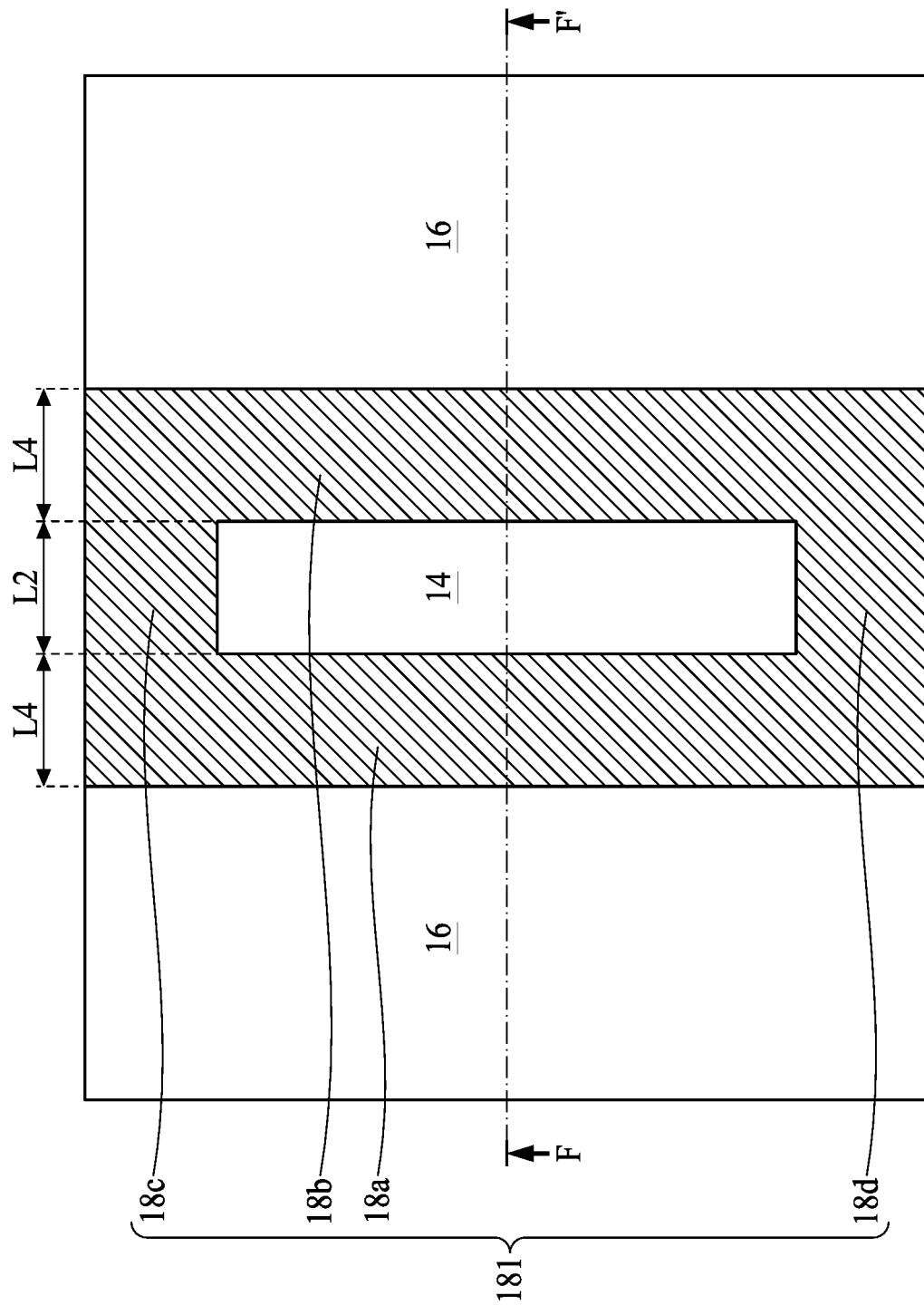
FIG. 3G is a top view of a portion of a semiconductor structure according to certain embodiments of the present disclosure.

In some embodiments, each of the spacers 18a and 18b can be a portion of an overall spacer (for example, the spacer 181 shown in FIG. 3G). In some embodiments, each of the spacers 18a and 18b can be referred to as a portion of a spacer.

An interface 14i exists between the spacer 18a and the barrier layer 14. An interface 16i1 exists between the spacer 18a and the dielectric layer 16. An interface 16i2 exists between the spacer 18b and the dielectric layer 16. An interface 18i1 exists between the spacer 18a and the gate 20.

An interface 18i2 exists between the spacer 18b and the gate 20. In some embodiments, the interfaces 14i and 16i may be substantially flat surfaces. In some embodiments, the interfaces 18i1 and 18i2 may be curved surfaces. The interface 18i1 can also be referred to as an upper surface of the spacer 18a. The interface 18i2 can also be referred to as an upper surface of the spacer 18b.

A length L1 represents the distance between the interface 16i1 and the interface 16i2. The length L1 represents the gap or the recess of the dielectric layer 16. The length L1 can also be referred to as a width L1. A length L2 represents the smallest distance between the spacer 18a and the spacer 18b. The length L2 can also be referred to as a width L2. Referring to FIG. 1A, the length L2 is smaller than the length L1.

The length L1 can be larger than 250 nanometers (nm). In some embodiments, the length L1 can be, for example, around 300 nm. The length L2 can be less than 140 nm. The length L2 can be in a range of 120 nm to 140 nm. The length L2 can be in a range of 100 nm to 120 nm. The length L2 can be in a range of 80 nm to 100 nm. The length L2 can be in a range of 60 nm to 80 nm. The length L2 can be in a range of 40 nm to 60 nm. In some embodiments, the length L2 can be, for example, around 120 nm.

The drain 22 and the source 24 can be disposed on the dielectric layer 16. In some embodiments, the drain 22 and the source 24 may include, for example, but are not limited to, conductive materials. Conductive materials may include, but are not limited to, metals, alloys, doped semiconductor materials (e.g., doped crystalline silicon) or other suitable conductor materials.

The gate 20 can be disposed on the spacers 18a and 18b. The gate 20 may cover the spacers 18a and 18b. The gate 20 can be disposed on the dielectric layer 16. The gate 20 may cover a portion of the dielectric layer 16. The gate 20 may expose a portion of the dielectric layer 16.

A portion of the gate 20 can be disposed within the recess defined by the spacers 18a and 18b. The portion of the gate disposed between the spacers 18a and 18b may be referred to as a tapered portion. The term "tapered" in the present disclosure may means an object having a shape that gets narrower towards one end.

The gate 20 may include a recess 20r. The gate 20 may include curved surfaces 20s1 and 20s2. The recess 20r can be defined by the curved surfaces 20s1 and 20s2. The surface 20s1 can be a convex surface. The surface 20s2 can be a convex surface. The dimension of the recess 20r decreases gradually in a direction toward the barrier layer 14.

In some embodiments, a portion of the gate 20 can be conformally disposed in accordance with the interface 18i1. In some embodiments, a portion of the gate 20 can be conformally disposed in accordance with the interface 18i2. In some embodiments, the surface 20s1 may include a curvature similar to that of the interface 18i1. In some embodiments, the surface 20s2 may include a curvature similar to that of the interface 18i2.

A portion of the gate 20 can be spaced apart from the dielectric layer 16. A portion of the gate 20 can be spaced apart from the barrier layer 14. A portion of the gate 20 may not contact the dielectric layer 16. A portion of the gate 20 may not contact the barrier layer 14.

In some embodiments, a portion of the gate 20 between the surface 20s1 and the interface 18i1 can be spaced apart from the dielectric layer 16. In some embodiments, a portion of the gate 20 between the surface 20s1 and the interface 18i1 can be spaced apart from the barrier layer 14. In some embodiments, a portion of the gate 20 between the surface 20s2 and the interface 18i2 can be spaced apart from the dielectric layer 16. In some embodiments, a portion of the gate 20 between the surface 20s2 and the interface 18i2 can be spaced apart from the barrier layer 14.

In some embodiments, a portion of the gate 20 can be laterally spaced apart from the dielectric layer 16. In some embodiments, a portion of the gate 20 can be laterally spaced apart from the dielectric layer 16 by the spacer 18a. In some embodiments, a portion of the gate 20 between the surface 20s1 and the interface 18i1 can be laterally spaced apart from the dielectric layer 16 by the spacer 18a.

In some embodiments, a portion of the gate 20 can be laterally spaced apart from the dielectric layer 16 by the spacer 18b. In some embodiments, a portion of the gate 20 between the surface 20s2 and the interface 18i2 can be laterally spaced apart from the dielectric layer 16 by the spacer 18b.

The gate 20 may include a stacked gate dielectric layer (not shown) and gate metal. The gate dielectric layer may include one or more layers of dielectric materials, such as silicon oxide, silicon nitride, high dielectric constant dielectric materials or other suitable dielectric materials. Gate metal may include, for example, but is not limited to, titanium (Ti), tantalum (Ta), tungsten (W), aluminum (Al), cobalt (Co), copper (Cu), nickel (Ni), platinum (Pt), lead (Pb), molybdenum (Mo) and its compounds (but not limited to, for example, titanium nitride (TiN), tantalum nitride (TaN) and other conductive nitrides, or conductive oxides), the metal alloy (such as aluminum copper alloy (Al—Cu)), or other appropriate material.

Figure 1B:
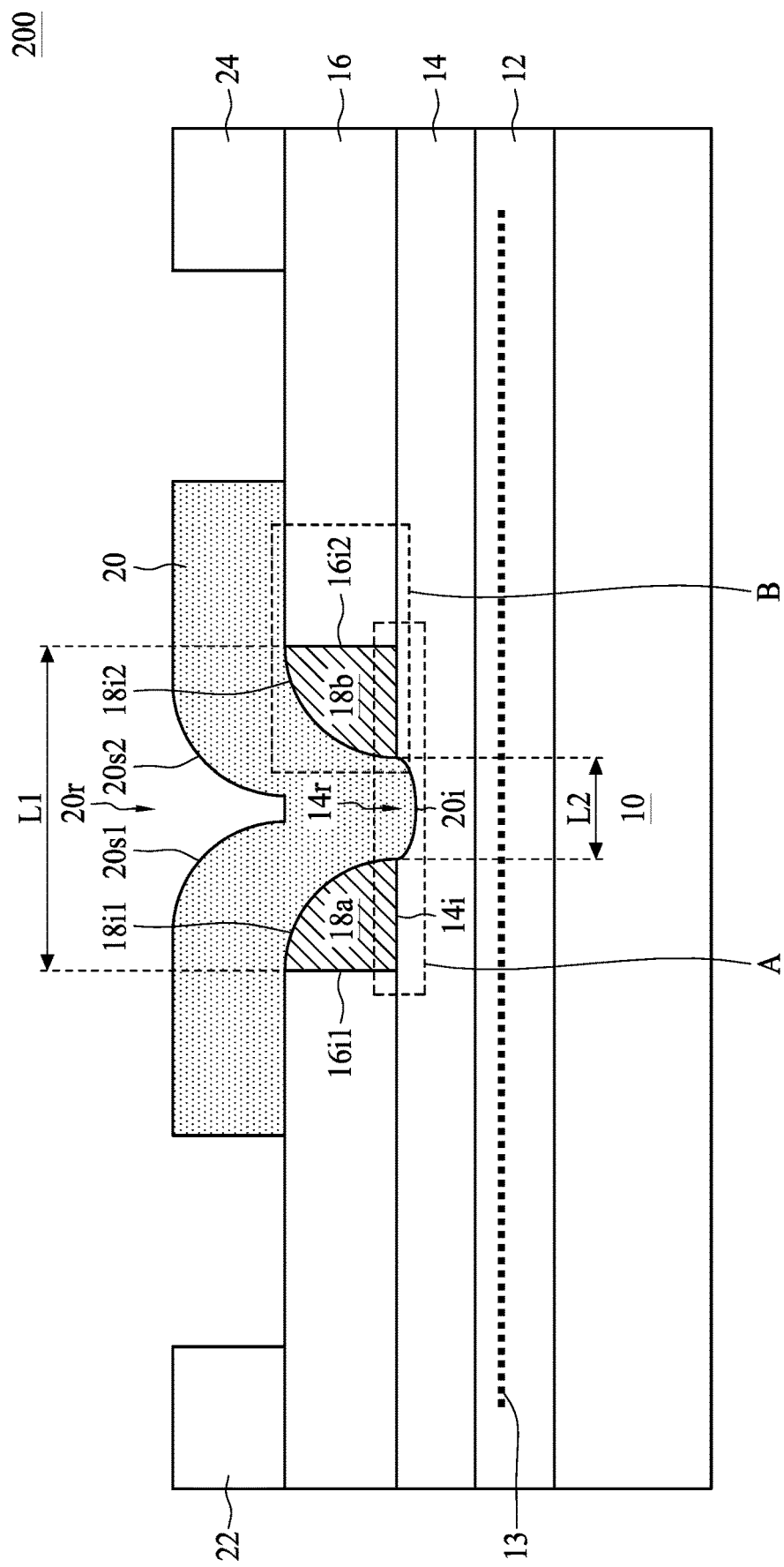
FIG. 1B is a simplified schematic cross-sectional view of a portion of a semiconductor structure according to certain embodiments of the present disclosure.

FIG. 1B is a simplified schematic cross-sectional view of a portion of a semiconductor structure according to certain embodiments of the present disclosure.

FIG. 1B shows a semiconductor structure 200 according to certain embodiments of the present disclosure. The semiconductor structure 200 can also be referred to as a semiconductor device or a semiconductor apparatus.

The semiconductor structure 200 shown in FIG. 1B is similar to the semiconductor structure 100 shown in FIG. 1A, except that the barrier layer 14 of the semiconductor structure 200 includes a recess 14r. The recess 14r may result from the etching process during the manufacturing of the semiconductor structure 200.

An enlarged view of the portion enclosed by the dotted rectangle A shown in FIG. 1B will be discussed in accordance with FIG. 1C. An enlarged view of the portion enclosed by the dotted rectangle B shown in FIG. 1B will be discussed in accordance with FIGS. 1D and 1E.

Figure 1C:
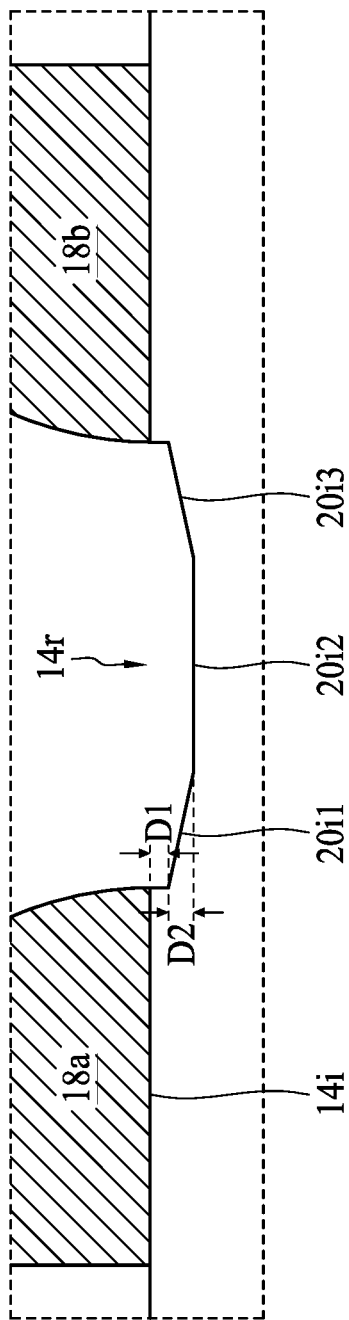
FIG. 1C is an enlarged view of a portion of a semiconductor structure according to certain embodiments of the present disclosure.

FIG. 1C is an enlarged view of a portion of a semiconductor structure according to certain embodiments of the present disclosure.

FIG. 1C shows a portion of the semiconductor structure 200. Referring to FIG. 1C, the bottom of the recess 14r may include portions 20i1, 20i2 and 20i3. The portions 20i1, 20i2 and 20i3 are continuously connected. In some embodiments, the bottom of the recess 14r may include more than three portions that are continuously connected. In some embodiments, the bottom of the recess 14r may include fewer portions.

The portion 20i1 is lower than the interface 14i between the spacer 18a and the barrier layer 14. The portion 20i1 is not coplanar with the interface 14i between the spacer 18a and the barrier layer 14. In some embodiments, the portion 20i1 can be an inclined surface of the barrier layer 14.

The portion 20i2 is lower than the interface 14i between the spacer 18a and the barrier layer 14. The portion 20i2 is not coplanar with the interface 14i between the spacer 18a and the barrier layer 14. In some embodiments, the portion 20i2 can be a horizontal surface of the barrier layer 14.

The portion 20i3 is lower than the interface 14i between the spacer 18a and the barrier layer 14. The portion 20i3 is not coplanar with the interface 14i between the spacer 18a and the barrier layer 14. In some embodiments, the portion 20i3 can be an inclined surface of the barrier layer 14.

A depth D1 exists between the shallowest part of the portion 20i1 and the interface 14i. A depth D2 exists between the portion 20i2 and the interface 14i. In some embodiments, the depth D2 is greater than the depth D1.

Figure 1E:
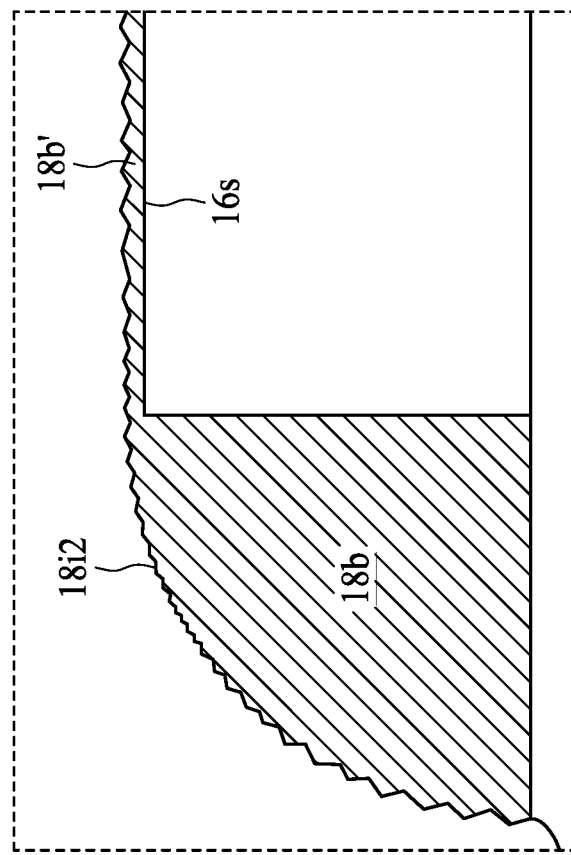
FIG. 1E is an enlarged view of a portion of a semiconductor structure according to certain embodiments of the present disclosure.
Figure 1D:
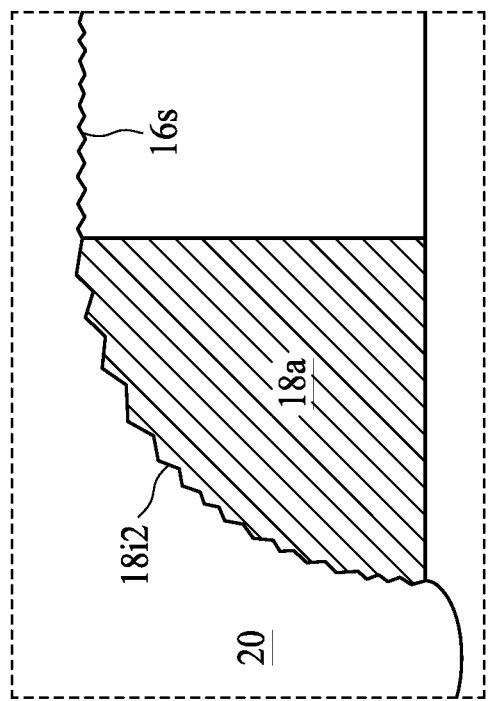
FIG. 1D is an enlarged view of a portion of a semiconductor structure according to certain embodiments of the present disclosure.

FIG. 1D is an enlarged view of a portion of a semiconductor structure according to certain embodiments of the present disclosure.

FIG. 1D shows a portion of the semiconductor structure 200 according to certain embodiments of the present disclosure. Referring to FIG. 1D, the interface 18i2 between the spacer 18b and the gate 20 may be a relatively rough surface. The surface 16s of the dielectric layer 16 may be a relatively rough surface. The relatively rough interface 18i2 can result from the etching process during the manufacturing of the semiconductor structure 200. The relatively rough surface 16s can result from the etching process during the manufacturing of the semiconductor structure 200.

FIG. 1E is an enlarged view of a portion of a semiconductor structure according to certain embodiments of the present disclosure.

FIG. 1E shows a portion of the semiconductor structure 200 according to certain embodiments of the present disclosure. The spacer 18b shown in FIG. 1E includes a portion 18b' extending on the surface 16s of the dielectric layer 16. The portion 18b' can result from the etching process during the manufacturing of the semiconductor structure 200.

The interface 18i2 between the spacer 18b and the gate 20 may be a relatively rough surface. The relatively rough interface 18i2 can result from the etching process during the manufacturing of the semiconductor structure 200.

Figure 1F:
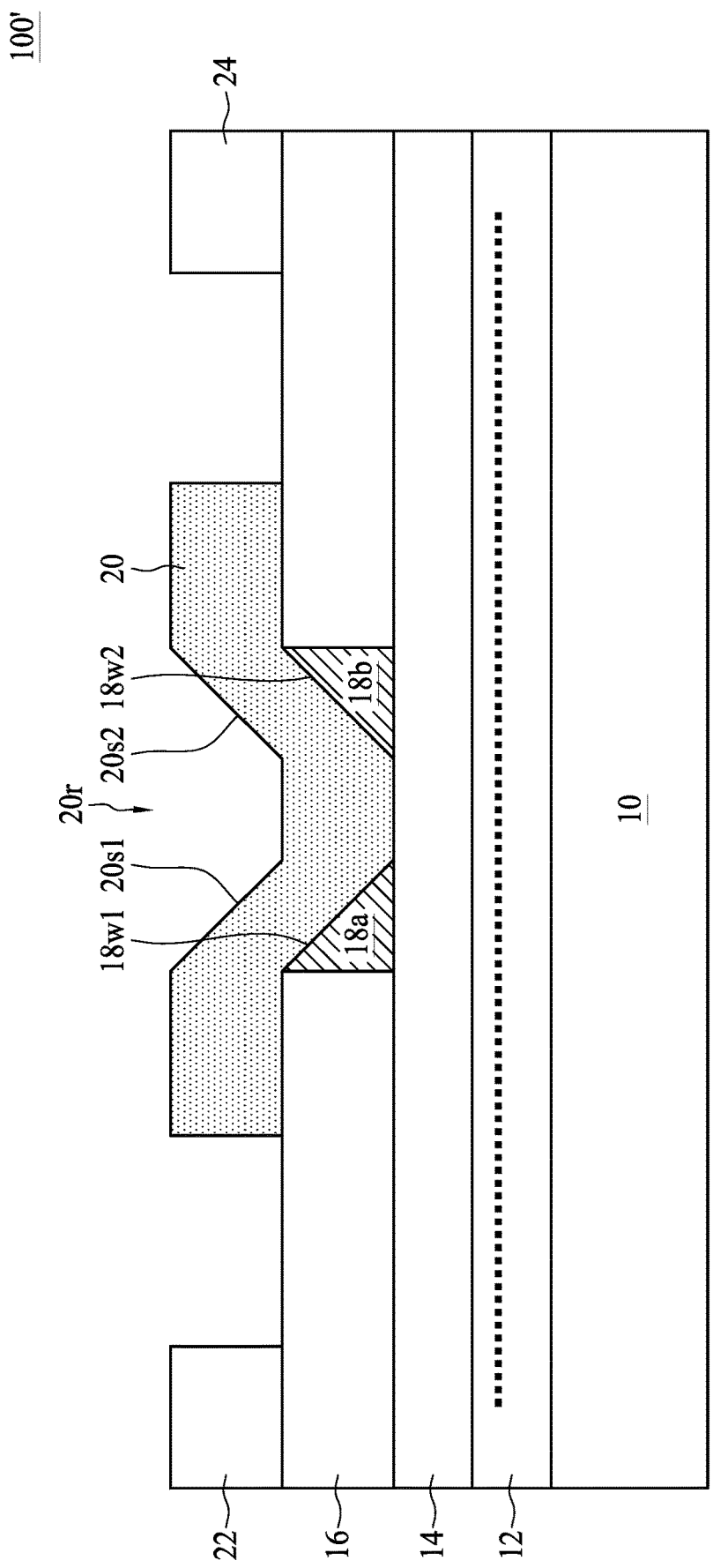
FIG. 1F is a simplified schematic cross-sectional view of a portion of a semiconductor structure according to certain embodiments of the present disclosure.

FIG. 1F is a simplified schematic cross-sectional view of a portion of a semiconductor structure according to certain embodiments of the present disclosure.

FIG. 1F shows a semiconductor structure 100' according to certain embodiments of the present disclosure. The semiconductor structure 100' can also be referred to as a semiconductor device or a semiconductor apparatus.

As shown in FIG. 1F, the semiconductor structure 100' includes a substrate 10, a channel layer 12, a barrier layer 14, a dielectric layer 16, a gate 20, a drain 22 and a source 24. The semiconductor structure 100' further includes spacers 18a and 18b. The semiconductor structure 100' shown in FIG. 1F is similar to the semiconductor structure 100 shown in FIG. 1A, except that the spacers 18a and 18b and the gate 20 of the semiconductor structure 100' have different profiles.

Referring to FIG. 1F, the spacer 18a includes a sidewall 18w1, and the spacer 18b includes a sidewall 18w2. The sidewall 18w1 can also be referred to as a surface. The sidewall 18w2 can also be referred to as a surface. The sidewall 18w1 can also be referred to as an interface between the spacer 18a and the gate 20. The sidewall 18w2 can also be referred to as an interface between the spacer 18b and the gate 20.

The sidewall 18w1 can be an inclined surface. The sidewall 18w2 can be an inclined surface. The sidewall 18w1 can be a relatively rough surface. The sidewall 18w2 can be a relatively rough surface. The sidewall 18w1 comes gradually closer toward the sidewall 18w2. The sidewall 18w2 comes gradually closer toward the sidewall 18w1.

The gate 20 includes a recess 20r. The gate 20 includes a surface 20s1 and a surface 20s2. The slope of the surface 20s1 may be substantially identical to that of the sidewall 18w1. The slope of the surface 20s2 may be substantially identical to that of the sidewall 18w2. The gate 20 includes a tapered portion between the spacers 18a and 18b. The gate 20 includes a tapered portion in the recess defined by the sidewall 18w1, the side wall 18w2 and the exposed surface of the barrier layer 14.

Figure 1G:
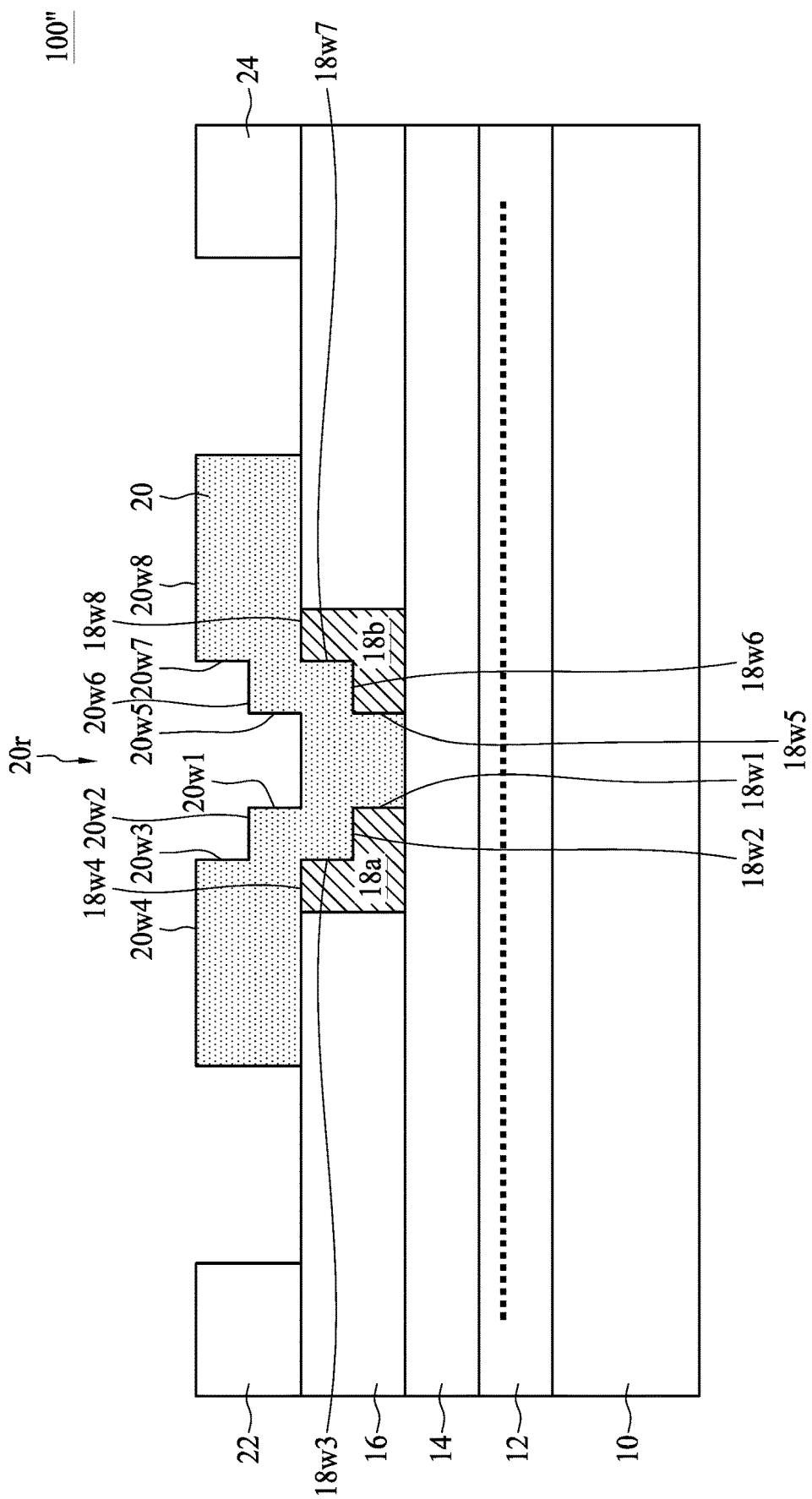
FIG. 1G is a simplified schematic cross-sectional view of a portion of a semiconductor structure according to certain embodiments of the present disclosure.

FIG. 1G is a simplified schematic cross-sectional view of a portion of a semiconductor structure according to certain embodiments of the present disclosure.

FIG. 1G shows a semiconductor structure 100" according to certain embodiments of the present disclosure. The semiconductor structure 100" can also be referred to as a semiconductor device or a semiconductor apparatus.

As shown in FIG. 1G, the semiconductor structure 100" includes a substrate 10, a channel layer 12, a barrier layer 14, a dielectric layer 16, a gate 20, a drain 22 and a source 24. The semiconductor structure 100" further includes spacers 18a and 18b. The semiconductor structure 100" shown in FIG. 1G is similar to the semiconductor structure 100 shown in FIG. 1A, except that the spacers 18a and 18b and the gate 20 of the semiconductor structure 100" have different profiles.

The spacer 18a includes a step structure defined by sidewalls 18w1 and 18w2. The spacer 18a further includes another step structure defined by sidewalls 18w3 and 18w4. The spacer 18b includes a step structure defined by sidewalls 18w5 and 18w6. The spacer 18b further includes another step structure defined by sidewalls 18w7 and 18w8. Each of the sidewalls 18w1, 18w2, 18w3, 18w4, 18w5, 18w6, 18w7 and 18w8 can also be referred to as a surface. Each of the sidewalls 18w1, 18w2, 18w3 and 18w4 can also be referred to as an interface between the spacer 18a and the gate 20. Each of the sidewalls 18w5, 18w6, 18w7 and 18w8 can also be referred to as an interface between the spacer 18b and the gate 20.

The gate 20 includes a step structure defined by sidewalls 20w1 and 20w2. The gate 20 further includes another step structure defined by sidewalls 20w3 and 20w4. The gate 20 includes a step structure defined by sidewalls 20w5 and 20w6. The gate 20 further includes another step structure defined by sidewalls 20w7 and 20w8.

The portion of the gate 20 between the spacer 18a and the spacer 18b can be referred to as a tapered portion.

Figure 2A:
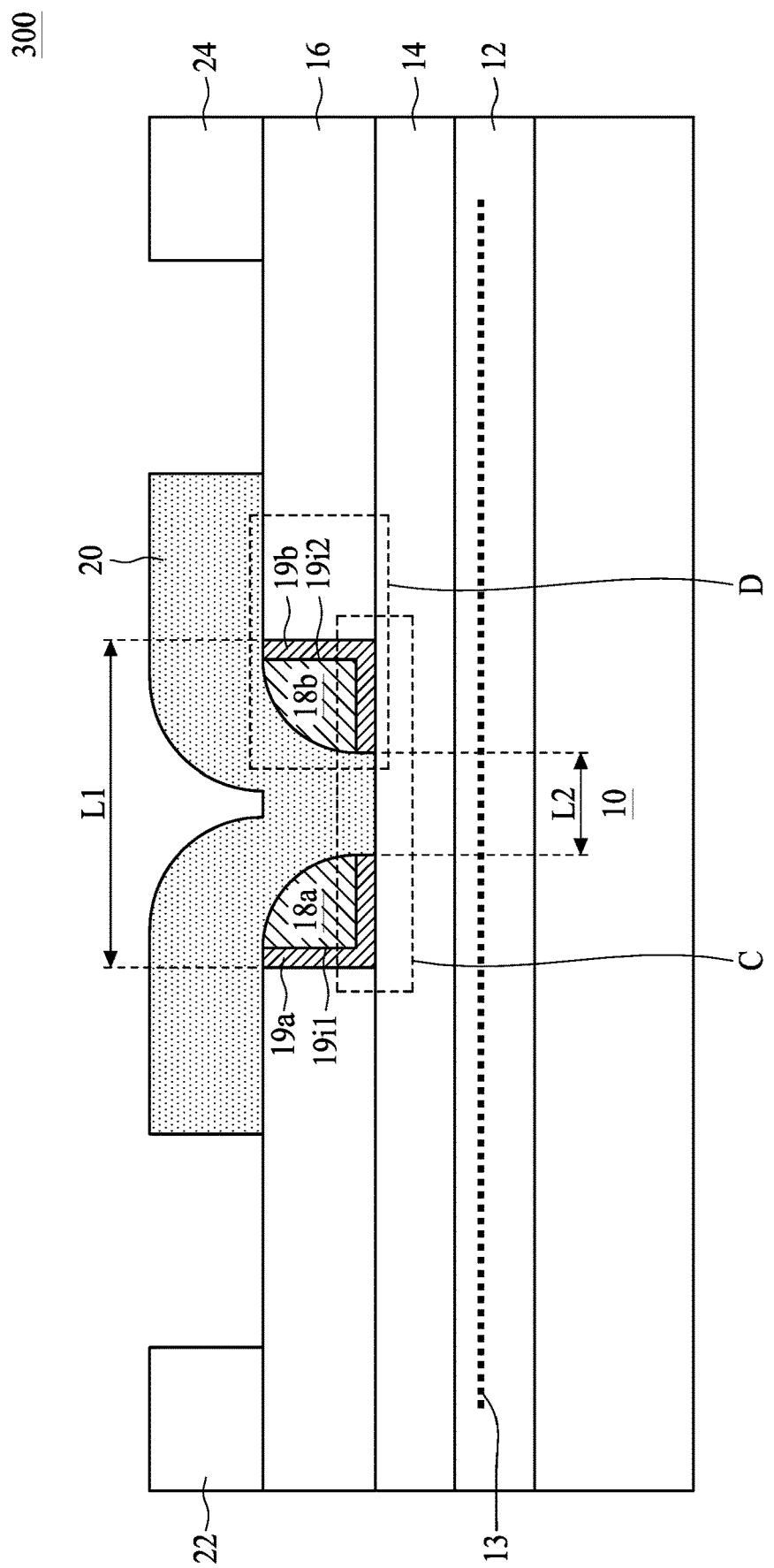
FIG. 2A is a simplified schematic cross-sectional view of a portion of a semiconductor structure according to certain embodiments of the present disclosure.

FIG. 2A is a simplified schematic cross-sectional view of a portion of a semiconductor structure according to certain embodiments of the present disclosure.

FIG. 2A shows a semiconductor structure 300 according to certain embodiments of the present disclosure. The semiconductor structure 300 can also be referred to as a semiconductor device or a semiconductor apparatus.

As shown in FIG. 2A, the semiconductor structure 300 includes a substrate 10, a channel layer 12, a barrier layer 14, a dielectric layer 16, a gate 20, a drain 22 and a source 24. The semiconductor structure 100 further includes spacers 18a and 18b and protection layers 19a and 19b.

The semiconductor structure 300 shown in FIG. 2A is similar to the semiconductor structure 100 shown in FIG. 1A, except that the semiconductor structure 300 further includes protection layers 19a and 19b. The protection layer 19a can be disposed between the dielectric layer 16 and the spacer 18a. The protection layer 19b can be disposed between the dielectric layer 16 and the spacer 18b.

An interface 19i1 exists between the spacer 18a and the protection layer 19a. An interface 19i2 exists between the spacer 18b and the protection layer 19b. A length L1 represents the distance between the interface 19i1 and the interface 19i2. A length L2 represents the smallest distance between the spacer 18a and the spacer 18b. Referring to FIG. 2A, the length L2 is smaller than the length L1.

An enlarged view of the portion enclosed by the dotted rectangle C shown in FIG. 2A will be discussed in accordance with FIG. 2B. An enlarged view of the portion enclosed by the dotted rectangle D shown in FIG. 2A will be discussed in accordance with FIGS. 2C and 2D.

Figure 2B:
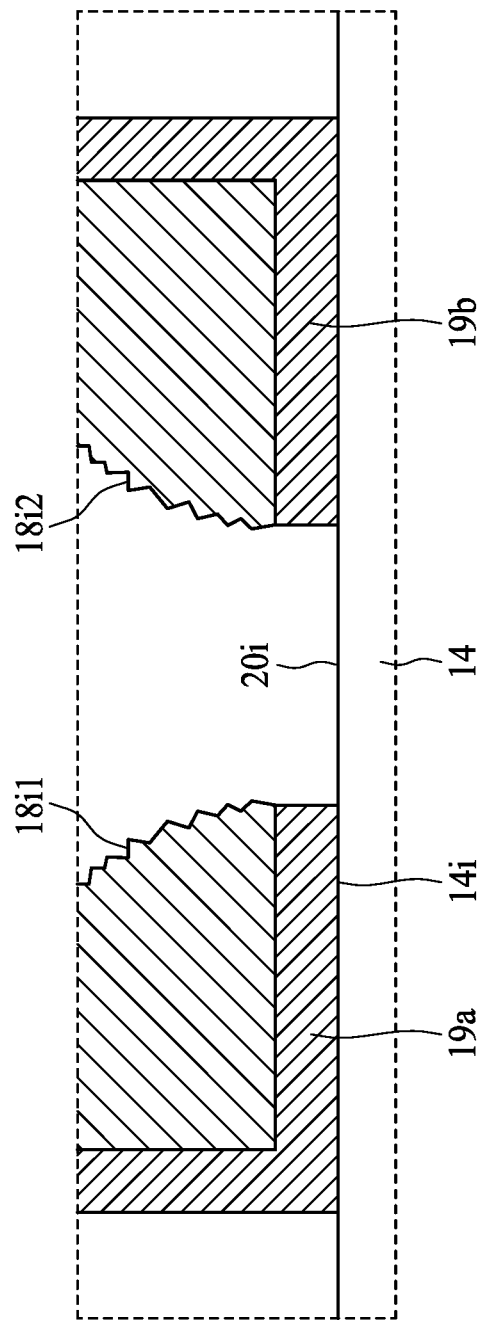
FIG. 2B is an enlarged view of a portion of a semiconductor structure according to certain embodiments of the present disclosure.

FIG. 2B is an enlarged view of a portion of a semiconductor structure according to certain embodiments of the present disclosure.

FIG. 2B shows a portion of the semiconductor structure 300. Referring to FIG. 2B, the interface 18i1 between the gate 20 and the spacer 18a can be a relatively rough surface. The interface 18i2 between the gate 20 and the spacer 18b can be a relatively rough surface. An interface 20i exists between the gate 20 and the barrier layer 14. The interface 20i can also be a surface of the barrier layer 14. In some embodiments, the interface 20i can be a substantially flat surface. In some embodiments, the interface 20i can be a relatively smooth surface.

An interface 14i exists between the protection layer 19a and the barrier layer 14. In some embodiments, the interface 14i can be coplanar with the interface 20i.

Figure 2C:
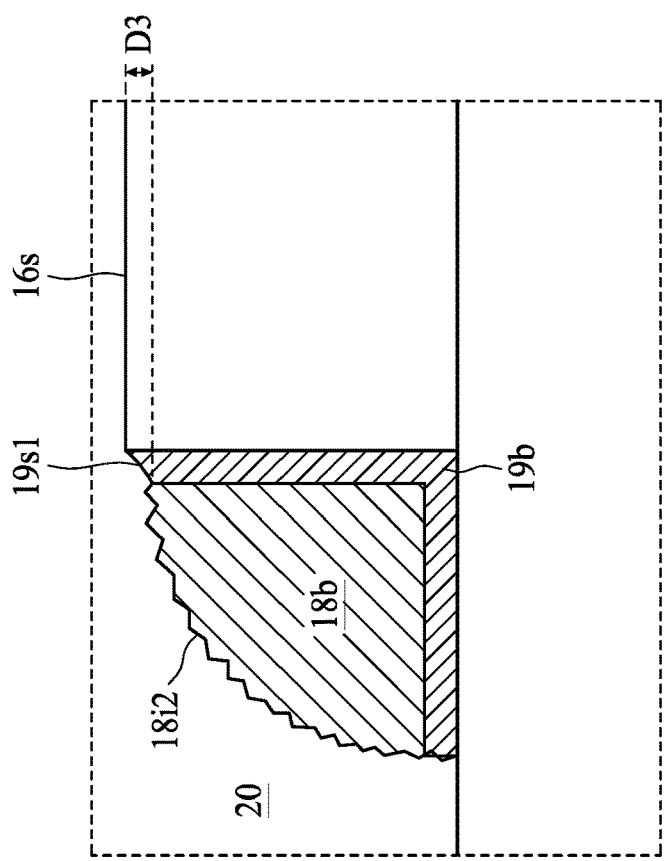
FIG. 2C is an enlarged view of a portion of a semiconductor structure according to certain embodiments of the present disclosure.

FIG. 2C is an enlarged view of a portion of a semiconductor structure according to certain embodiments of the present disclosure.

FIG. 2C shows a portion of the semiconductor structure 300 according to certain embodiments of the present disclosure. Referring to FIG. 2C, the interface 18i2 between the spacer 18b and the gate 20 may be a relatively rough surface. The surface 16s of the dielectric layer 16 may be a substantially flat surface. The surface 16s of the dielectric layer 16 can be a relatively smooth surface. The relatively rough interface 18i2 can result from the etching process during the manufacturing of the semiconductor structure 300.

The protection layer 19b may include a curved surface 19s1 located between the spacer 18b and the dielectric layer 16. The curved surface 19s1 can result from the etching process during the manufacturing of the semiconductor structure 300.

Referring to FIG. 2C, the topmost portion of the spacer 18b may not be coplanar with the surface 16s. In some embodiments, the topmost portion of the spacer 18b is lower than the surface 16s. In some embodiments, a distance D3 exists between the topmost portion of the spacer 18b and the surface 16s.

Although FIG. 2C merely shows the structures/details around the spacer 18b and the protection layer 19b, it can be contemplated that the spacer 18a and the protection layer 19a may have features similar to those shown in FIG. 2C.

Figure 2D:
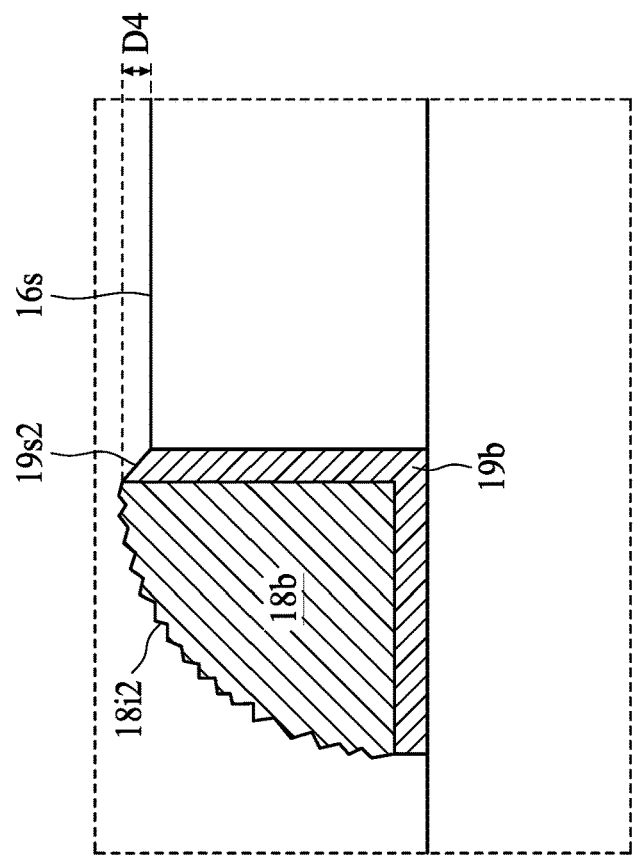
FIG. 2D is an enlarged view of a portion of a semiconductor structure according to certain embodiments of the present disclosure.

FIG. 2D is an enlarged view of a portion of a semiconductor structure according to certain embodiments of the present disclosure.

FIG. 2D shows a portion of the semiconductor structure 300 according to certain embodiments of the present disclosure. Referring to FIG. 2D, the interface 18i2 between the spacer 18b and the gate 20 may be a relatively rough surface. The surface 16s of the dielectric layer 16 may be a substantially flat surface. The relatively rough interface 18i2 can result from the etching process during the manufacturing of the semiconductor structure 300.

The protection layer 19b may include a curved surface 19s2 located between the spacer 18b and the dielectric layer 16. The curved surface 19s2 can result from the etching process during the manufacturing of the semiconductor structure 300.

Referring to FIG. 2D, the topmost portion of the spacer 18b may not be coplanar with the surface 16s. In some embodiments, the topmost portion of the spacer 18b is higher than the surface 16s. In some embodiments, a distance D4 exists between the topmost portion of the spacer 18b and the surface 16s.

Although FIG. 2D merely shows the structures/details around the spacer 18b and the protection layer 19b, it can be contemplated that the spacer 18a and the protection layer 19a may have features similar to those shown in FIG. 2D.

FIG. 3A, FIG. 3B, FIG. 3C, FIG. 3D and FIG. 3E illustrate a method of manufacturing a semiconductor structure according to some embodiments of the present disclosure.

The operations shown in FIG. 3A, FIG. 3B, FIG. 3C, FIG. 3D and FIG. 3E may be utilized to produce a semiconductor structure similar to the semiconductor structure 100 shown in FIG. 1A. The operations shown in FIG. 3A, FIG. 3B, FIG. 3C, FIG. 3D and FIG. 3E may be utilized to produce a semiconductor structure similar to the semiconductor structure 200 shown in FIG. 1B.

Referring to FIG. 3A, a substrate 10 is provided, and a channel layer 12 is disposed on the upper surface of the substrate 10. A barrier layer 14 is then disposed on an upper surface of the channel layer 12. The polarization resulting from the heterojunction between the channel layer 12 and the barrier layer 14 forms a 2DEG region 13. In some embodiments, the 2DEG region 13 is formed within the channel layer 12. In some embodiments, the 2DEG region 13 is formed adjacent to the interface between the channel layer 12 and the barrier layer 14.

Referring to FIG. 3B, a dielectric layer 16 is disposed on the upper surface of the barrier layer 14. In some embodiments, the dielectric layer 16 can be formed by physical vapor deposition (PVD), chemical vapor deposition (CVD), atomic layer deposition (ALD), plating, and/or other suitable deposition steps.

A recess 16h is formed on the dielectric layer 16. A recess 16h is defined in the dielectric layer 16. The recess 16h exposes a portion of the barrier layer 14. The recess 16h exposes a surface 14s of the barrier layer 14. In some embodiments, the recess 16h can also be referred to as a trench.

The recess 16h can be formed by, for example, a photolithography process. The recess 16h can be formed by, for example, a photolithography machine. The recess 16h can be formed by, for example, laser ablation or laser grooving, plasma dicing, wet etching or dry etching of grooves or trenches, and or laser induced cleaving/splitting. The recess 16h can be formed by other suitable techniques.

Referring to FIG. 3C, a dielectric layer 18 is disposed on the dielectric layer 16. The dielectric layer 18 is disposed within the recess 16h. The dielectric layer 18 is disposed on the surface 14s of the barrier layer 14.

In some embodiments, the dielectric layer 18 may include materials identical to those of the dielectric layer 16. In some embodiments, the dielectric layer 18 may include materials different from those of the dielectric layer 16. In some embodiments, the dielectric layer 18 can be formed by physical vapor deposition (PVD), chemical vapor deposition (CVD), atomic layer deposition (ALD), plating, and/or other suitable deposition steps.

The dielectric layer 18 can be conformally formed above the dielectric layer 16 and the exposed barrier layer 14. The dielectric layer 18 includes a recess 18r. The recess 18r can also be referred to as a trench. The dielectric layer 18 has a thickness T1. The recess 18r has a width L3. The thickness T1 of the dielectric layer 18 may influence the width L3 of the recess 18r. In some embodiments, the width L3 of the recess 18r decreases in response to an increase of the thickness T1 of the dielectric layer 18. The width L3 can also be referred to as a length L3.

Referring to FIG. 3D, the portions of the dielectric layer 18 above the dielectric layer 16 are removed and some portions of the dielectric layer 18 within the recess 16h remain. The remaining portions of the dielectric layer 18 are then referred to as spacers 18a and 18b.

In some embodiments, the dielectric layer 18 can be removed, for example, by a dry etching technique. In some embodiments, the dielectric layer 18 can be removed, for example, by a dry blanket etching technique. The surface 16s of the dielectric layer 16 is exposed after the dry etching process. The surface 16s can be a relatively rough surface resulting from the dry etching process.

The spacer 18a includes a curved surface 18s1. The spacer 18b includes a curved surface 18s2. The surface 18s1 can be a convex surface. The surface 18s2 can be a convex surface. The surface 18s1 can be a relatively rough surface resulting from the dry etching process. The surface 18s2 can be a relatively rough surface resulting from the dry etching process.

The surface 18s1 may laterally connect the surface 16s of the dielectric layer 16 to the surface 14s of the barrier layer 14. The surface 18s1 may laterally connect between the surface 16s of the dielectric layer 16 and the surface 14s of the barrier layer 14. The surface 18s2 may laterally connect the surface 16s of the dielectric layer 16 to the surface 14s of the barrier layer 14. The surface 18s2 may laterally connect between the surface 16s of the dielectric layer 16 and the surface 14s of the barrier layer 14.

The spacer 18a and the spacer 18b define a recess 18h. The recess 18h can also be referred to as a trench. A length L1 is the top width of the recess 18h. A length L2 is the bottom width of the recess 18h. The length L2 can be the distance between the spacer 18a and the spacer 18b. The length L2 can be the width of the surface of the barrier 14 that is exposed by the spacers 18a and 18b.

The length L1 is greater than the length L2. The length of the recess 18h decreases gradually from the top of the recess 18h toward the bottom of the recess 18h. The dimension of the recess 18h decreases gradually from the top of the recess 18h toward the bottom of the recess 18h. The recess 18h can also be referred to as a tapered recess.

The length L2 of the recess 18h can correspond to the width L3 of the recess 18r shown in FIG. 3C. In some embodiments, the length L2 of the recess 18h decreases in response to a decrease of the width L3 of the recess 18r, and vice versa. Therefore, the length L2 can be controlled by modifying the width L3 of the recess 18r in the operation shown in FIG. 3C. Furthermore, the length L2 can be controlled by modifying the thickness T1 of the dielectric layer 18 in the operation shown in FIG. 3C.

Referring to FIG. 3E, a gate 20 is disposed on the dielectric layer 16, the spacers 18a and 18b, and the exposed surface of the barrier layer 14. In some embodiments, a portion of the gate 20 can be conformally disposed on the surface 18s1. In some embodiments, a portion of the gate 20 can be conformally disposed on the surface 18s2. In some embodiments, the surface 20s1 may include a curvature similar to that of the surface 18s1. In some embodiments, the surface 20s2 may include a curvature similar to that of the surface 18s2.

The surface 20s1 can be a convex surface. The surface 20s2 can be a convex surface.

A portion of the gate 20 within the recess 18h comprises a length L1, another portion of the gate 20 within the recess 18h comprises a length L2. The length L1 is greater than the length L2.

Since the top portion of the recess 18h has a larger length L1, materials for forming the gate 20 can be easily disposed within the recess 18h. The gate 20 can be integrally formed within the recess 18h, without any cracks or discontinuity.

Referring back to FIG. 3B and FIG. 3D, the length L2 of the bottom of the recess 18h is smaller than the length L1 of the bottom of the recess 16h. As a result, the gate 20 disposed within the recess 18h will have a smaller dimension near the exposed surface of the barrier layer 14. The gate 20 having a smaller dimension near the bottom of the recess 18h enables the semiconductor structures 100 and 200 to work or operate in a higher frequency.

The operations described in accordance with FIG. 3A, FIG. 3B, FIG. 3C, FIG. 3D, and FIG. 3E provides a gate 20 having a smaller dimension near the bottom of the recess 18h. The operations described in accordance with FIG. 3A, FIG. 3B, FIG. 3C, FIG. 3D, and FIG. 3E provides a semiconductor structure that can work in a higher frequency. The operations described in accordance with FIG. 3A, FIG. 3B, FIG. 3C, FIG. 3D, and FIG. 3E provides a mechanism for forming a recess 18h having a smaller bottom width, without the need of utilizing a photolithography machine with a higher precision.

FIG. 3F is a top view of a portion of a semiconductor structure according to certain embodiments of the present disclosure. FIG. 3F can be the top view of the semiconductor structure shown in FIG. 3D. The semiconductor structure shown in FIG. 3D can be a cross-sectional view along the dotted line E-E' of FIG. 3F.

The semiconductor structure shown in FIG. 3F includes a dielectric layer 16, spacers 18a and 18b and a barrier layer 14. The spacer 18a has a width L4, the spacer 18b has a width L4, and the barrier layer 14 has a width L2. In some embodiments, the width L4 can be in a range of 60 nm to 80 nm. In some embodiments, the width L4 can be in a range of 80 nm to 100 nm. In some embodiments, the width L4 can be in a range of 100 nm to 120 nm. In some embodiments, the width L4 can be around 90 nm.

The length L2 can be less than 140 nm. The length L2 can be in a range of 120 nm to 140 nm. The length L2 can be in a range of 100 nm to 120 nm. The length L2 can be in a range of 80 nm to 100 nm. The length L2 can be in a range of 60 nm to 80 nm. The length L2 can be in a range of 40 nm to 60 nm. In some embodiments, the length L2 can be, for example, around 120 nm.

FIG. 3G is a top view of a portion of a semiconductor structure according to certain embodiments of the present disclosure. FIG. 3G can be the top view of the semiconductor structure shown in FIG. 3D. The semiconductor structure shown in FIG. 3D can be a cross-sectional view along the dotted line F-F' of FIG. 3G.

Referring to FIG. 3G, the spacer 18a may be a portion of a spacer 181. The spacer 18b may be a portion of the spacer 181. The spacer 181 can include a portion 18c connected between the spacers 18a and 18b. The spacer 181 can include a portion 18d connected between the spacers 18a and 18b. The spacer 181 exposes a portion of the barrier layer 14. The spacer 181 surrounds the peripherals of the exposed portion of the barrier layer 14.

FIG. 4A, FIG. 4B, FIG. 4C, FIG. 4D, FIG. 4E and FIG. 4F illustrate a method of manufacturing a semiconductor structure according to some embodiments of the present disclosure.

The operations shown in FIG. 4A, FIG. 4B, FIG. 4C, FIG. 4D, FIG. 4E and FIG. 4F may be utilized to produce a semiconductor structure similar to the semiconductor structure 300 shown in FIG. 2A.

Figure 4A:
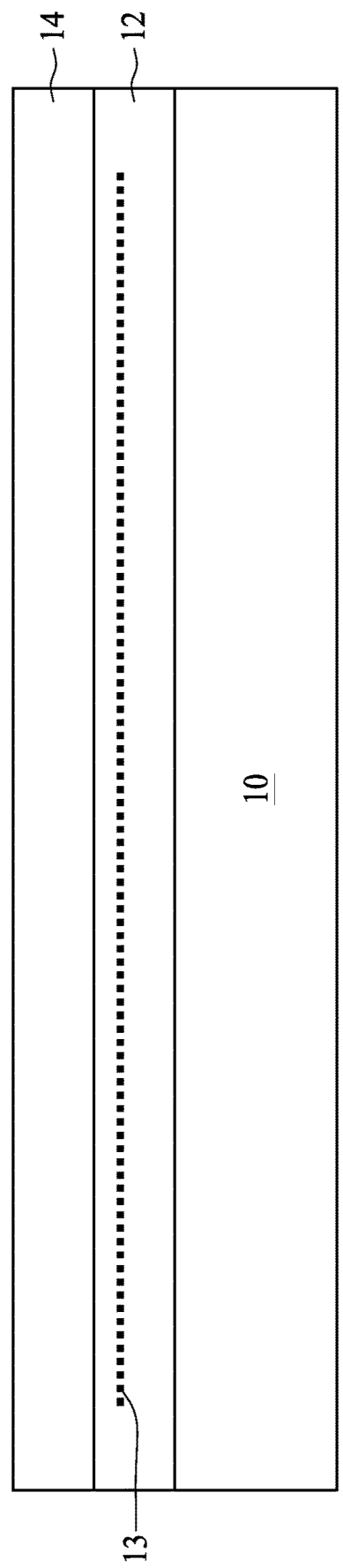
FIG. 4A, FIG. 4B, FIG. 4C, FIG. 4D, FIG. 4E and FIG. 4F illustrate a method of manufacturing a semiconductor structure according to some embodiments of the present disclosure.

Referring to FIG. 4A, a substrate 10 is provided, and a channel layer 12 is disposed on the upper surface of the substrate 10. A barrier layer 14 is then disposed on an upper surface of the channel layer 12. The polarization resulting from the heterojunction between the channel layer 12 and the barrier layer 14 forms a 2DEG region 13. In some embodiments, the 2DEG region 13 is formed within the channel layer 12. In some embodiments, the 2DEG region 13 is formed adjacent the interface between the channel layer 12 and the barrier layer 14.

Figure 4B:
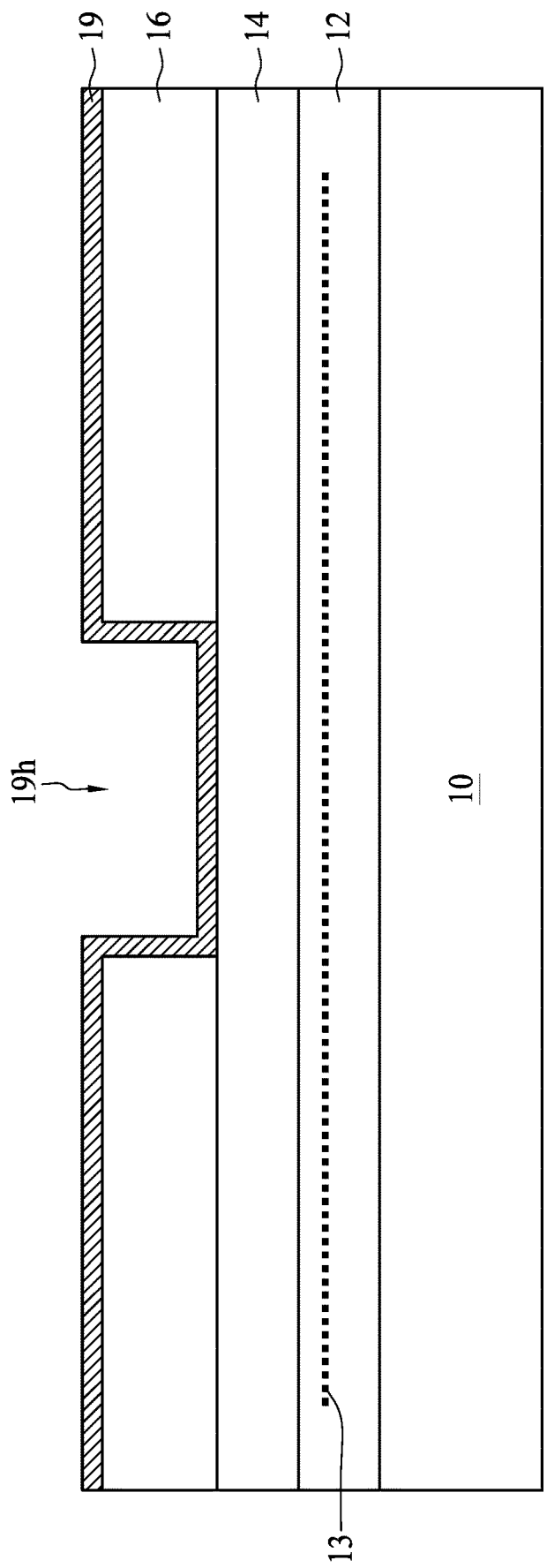

Referring to FIG. 4B, a dielectric layer 16 is disposed on the upper surface of the barrier layer 14. The dielectric layer 16 includes a recess exposing a surface of the barrier layer 14. A protection layer 19 is then disposed on the dielectric layer 16 and the exposed portion of the barrier layer 14.

The protection layer 19 may act as an etch stop layer. In some embodiments, the protection layer 19 may include aluminum oxide ($Al_2O_3$), silicon dioxide ($SiO_2$), silicon nitride ($Si_3N_4$) or any other appropriate materials. The protection layer 19 defines a recess 19h.

Figure 4C:
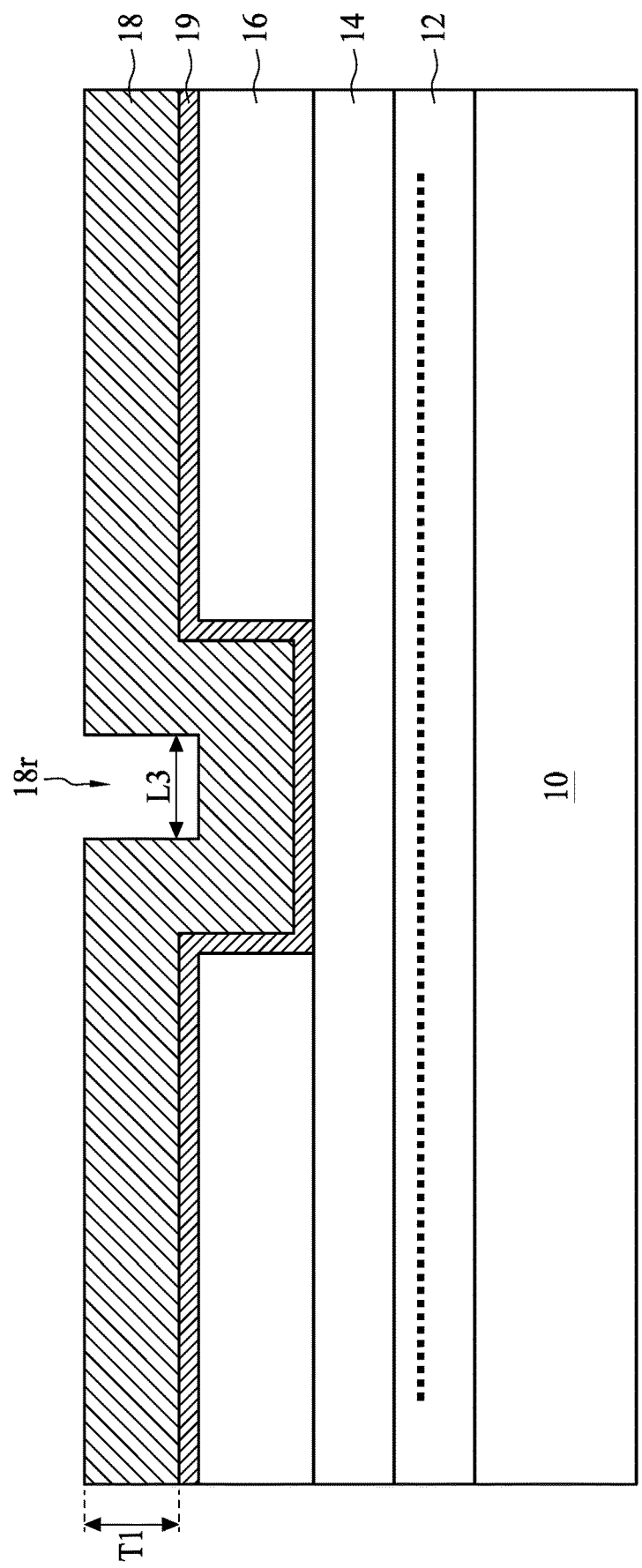

Referring to FIG. 4C, a dielectric layer 18 is disposed on the protection layer 19. The dielectric layer 18 is disposed within the recess 19h.

In some embodiments, the dielectric layer 18 may include materials identical to those of the dielectric layer 16. In some embodiments, the dielectric layer 18 may include materials different from those of the dielectric layer 16. In some embodiments, the dielectric layer 18 can be formed by physical vapor deposition (PVD), chemical vapor deposition (CVD), atomic layer deposition (ALD), plating, and/or other suitable deposition steps.

The dielectric layer 18 can be conformally formed above the protection layer 19. The dielectric layer 18 includes a recess 18r. The recess 18r can also be referred to as a trench. The dielectric layer 18 has a thickness T1. The recess 18r has a width L3. The thickness T1 of the dielectric layer 18 may influence the width L3 of the recess 18r. In some embodiments, the width L3 of the recess 18r decreases in response to an increase of the thickness T1 of the dielectric layer 18.

Figure 4D:
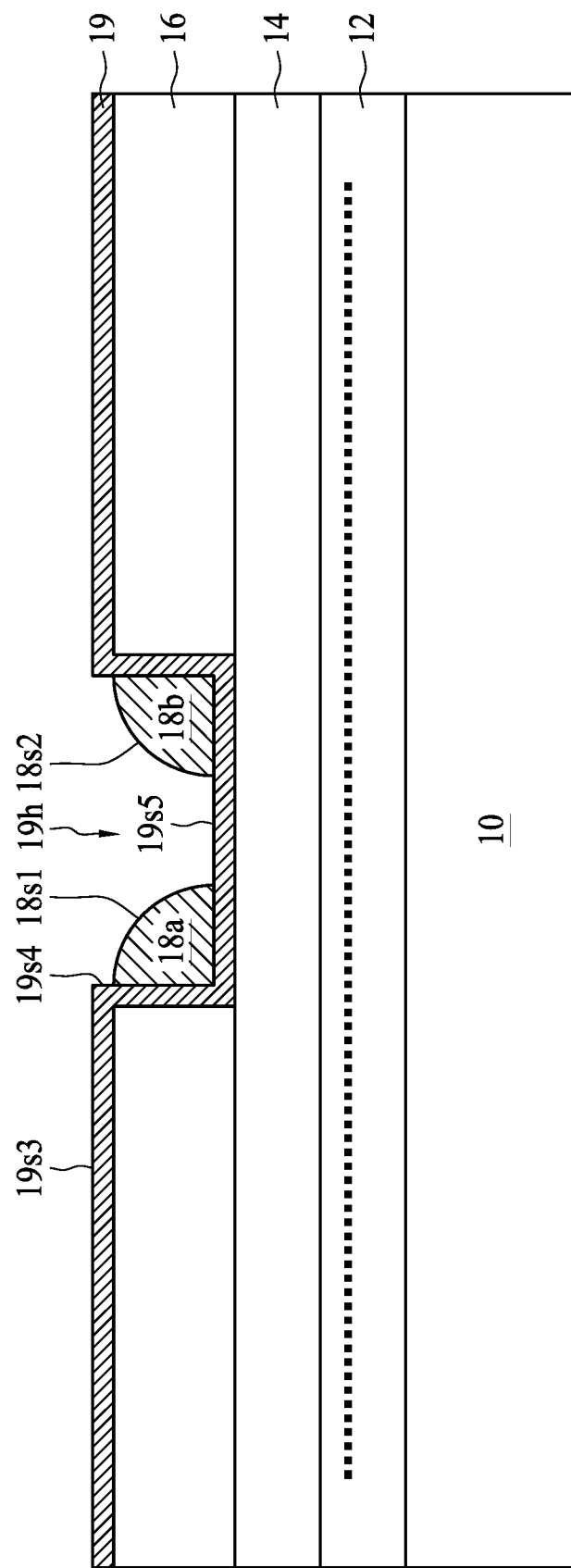

Referring to FIG. 4D, the portions of the dielectric layer 18 above the protection layer 19 are removed and some portions of the dielectric layer 18 within the recess 19h remain. The remaining portions of the dielectric layer 18 are then referred to as spacers 18a and 18b.

In some embodiments, the dielectric layer 18 can be removed, for example, by a dry etching technique. In some embodiments, the dielectric layer 18 can be removed, for example, by a dry blanket etching technique.

The surface 19s3 of the protection layer 19 is exposed after the dry etching process. The surface 19s4 of the protection layer 19 is exposed after the dry etching process. The surface 19s5 of the protection layer 19 is exposed after the dry etching process. The surface 18s1 can be a relatively rough surface resulting from the dry etching process. The surface 18s2 can be a relatively rough surface resulting from the dry etching process.

Figure 4E:
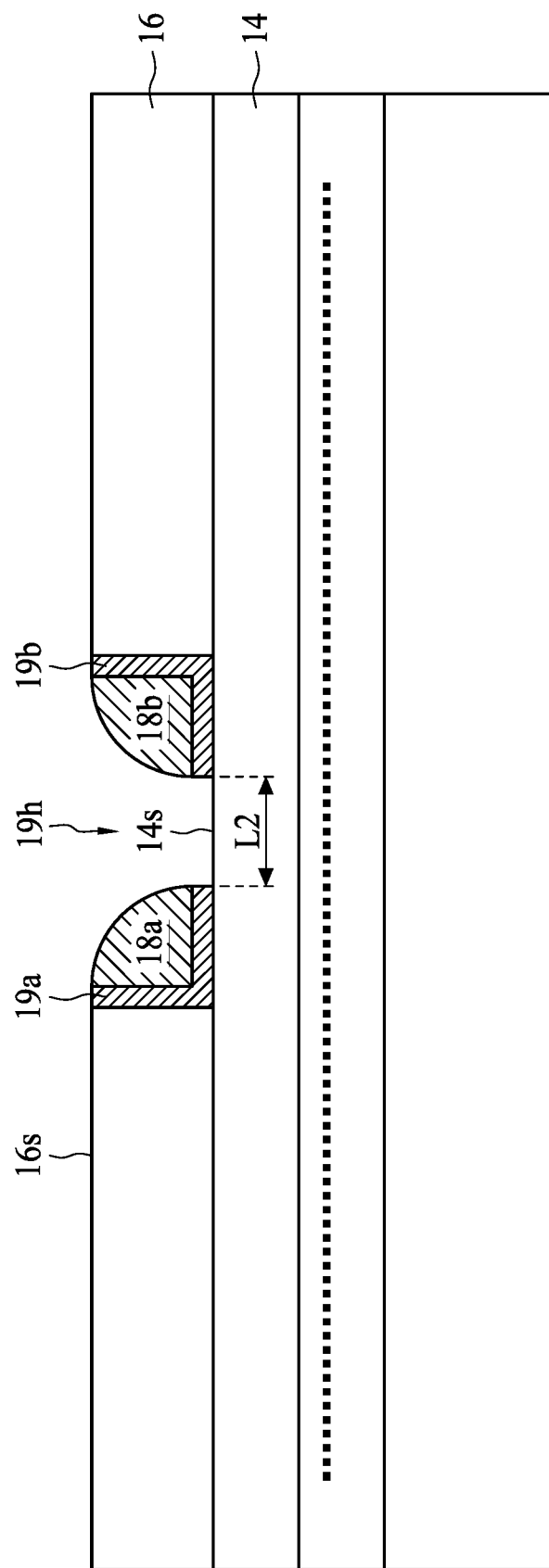

Referring to FIG. 4E, the portions of the protection layer 19 above the dielectric layer 16 are removed. The portion of the protection layer 19 above the barrier layer 14 is removed. The protection layer 19 may be removed by, for example, a wet etching process. The protection layer 19 may be removed by, for example, a wet etching process having high etching selectivity.

After a wet etching process, protection layers 19a and 19b remain. The protection layer 19a includes a portion disposed between the spacer 18a and the dielectric layer 16. The protection layer 19a includes a portion disposed between the spacer 18a and the barrier layer 14. The protection layer 19b includes a portion disposed between the spacer 18a and the dielectric layer 16. The protection layer 19b includes a portion disposed between the spacer 18a and the barrier layer 14.

The surface 16s of the dielectric layer 16 can be a relatively smooth surface. The surface 14s of the barrier layer 14 can be a relatively smooth surface.

The length L2 of the recess 19h can correspond to the width L3 of the recess 18r shown in FIG. 4C. In some embodiments, the length L2 of the recess 19h decreases in response to a decrease of the width L3 of the recess 18r, and vice versa. Therefore, the length L2 can be controlled by modifying the width L3 of the recess 18r in the operation shown in FIG. 4C. Furthermore, the length L2 can be controlled by modifying the thickness T1 of the dielectric layer 18 in the operation shown in FIG. 4C.

Referring to FIG. 4D and FIG. 4E, the protection layer 19 may prevent the exposed portion of the barrier layer 14 from being lost during the dry etching process. The protection layer 19 may prevent a recess (for example, the recess 14r of FIGS. 1B and 1C) from forming on the barrier layer 14. A recess on the barrier layer 14 may adversely affect the performance of the semiconductor device manufactured. A recess on the barrier layer 14 having a depth over a specific value may adversely affect the performance of the semiconductor device manufactured.

Figure 4F:
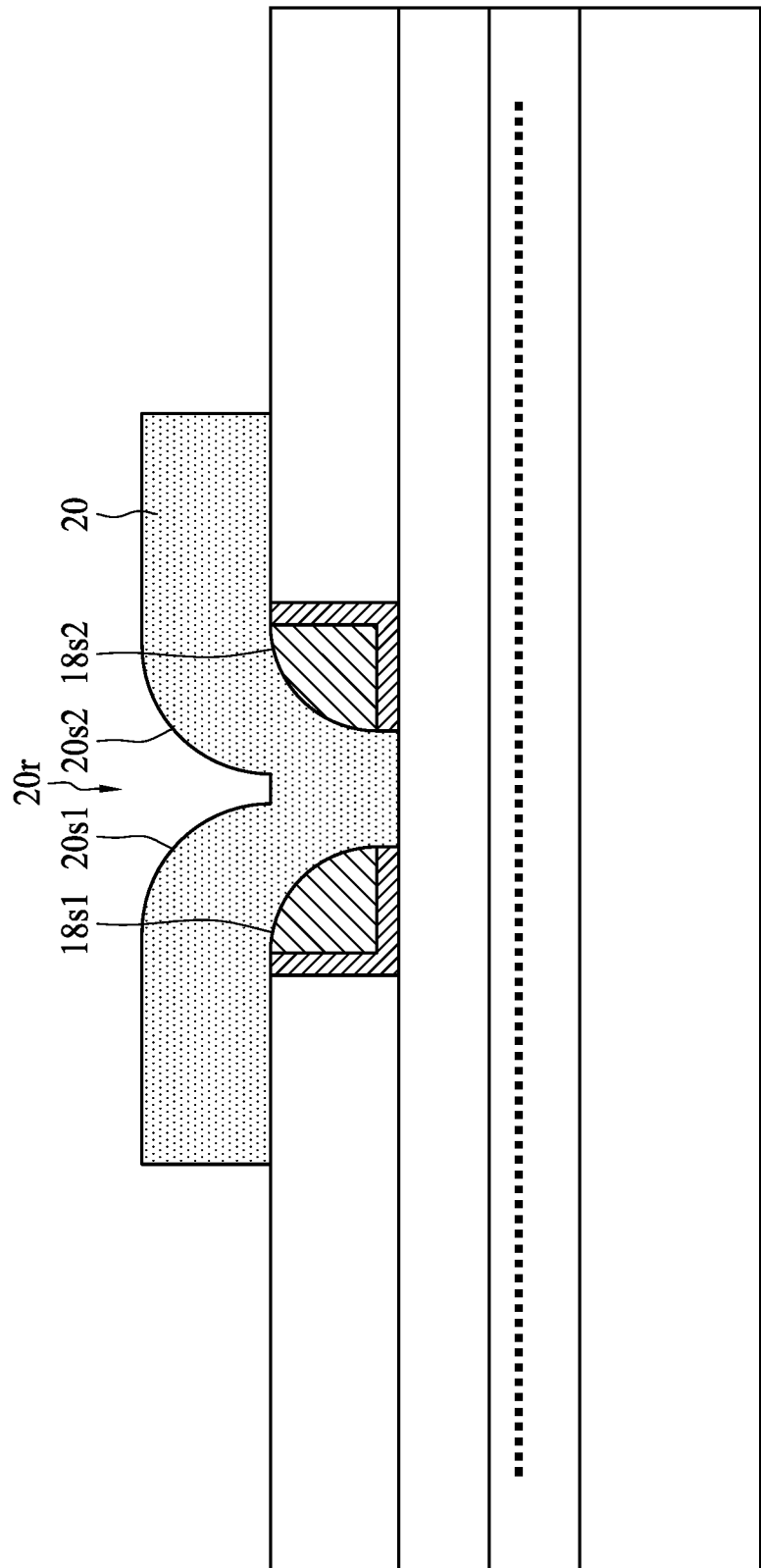

Referring to FIG. 4F, a gate 20 is disposed on the dielectric layer 16, the spacers 18a and 18b, the protection layers 19a and 19b, and the surface 14s of the barrier layer 14.

In some embodiments, a portion of the gate 20 can be conformally disposed on the surface 18s1. In some embodiments, a portion of the gate 20 can be conformally disposed on the surface 18s2. In some embodiments, the surface 20s1 may include a curvature similar to that of the surface 18s1. In some embodiments, the surface 20s2 may include a curvature similar to that of the surface 18s2.

The gate 20 may include a recess 20r. The gate 20 may include curved surfaces 20s1 and 20s2. The recess 20r can be defined by the curved surfaces 20s1 and 20s2. The surface 20s1 can be a convex surface. The surface 20s2 can be a convex surface.

Figure 5:
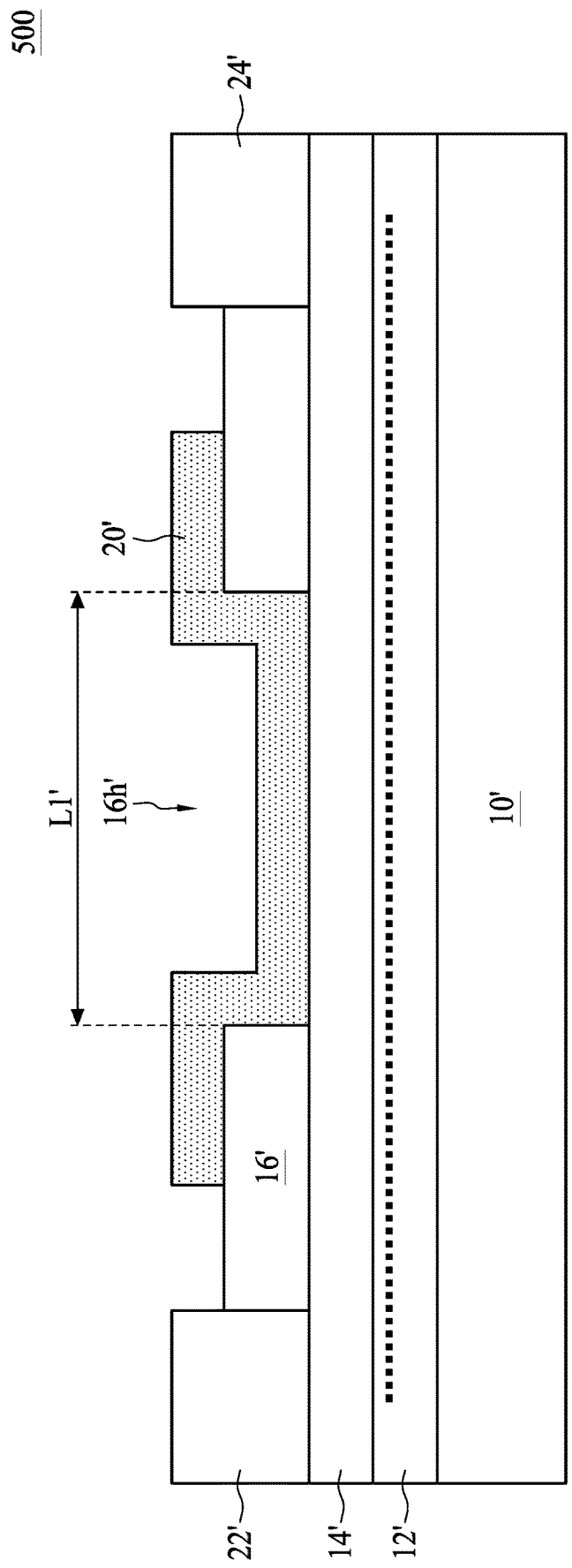
FIG. 5 is a simplified schematic cross-sectional view of a portion of a semiconductor structure according to certain comparative embodiments of the present disclosure.

FIG. 5 is a simplified schematic cross-sectional view of a portion of a semiconductor structure according to certain comparative embodiments of the present disclosure.

FIG. 5 shows a semiconductor structure 500 according to certain comparative embodiments of the present disclosure. The semiconductor structure 500 can also be referred to as a semiconductor device or a semiconductor apparatus.

As shown in FIG. 5, the semiconductor structure 500 includes a substrate 10', a channel layer 12', a barrier layer 14', a dielectric layer 16', a gate 20', a drain 22' and a source 24'.

The dielectric layer 16' includes a recess 16h' and a portion of the gate 20' is disposed within the recess 16h'. The recess 16h' has a length L1'. In some embodiments, the length L1' can be larger than 250 nm. In some embodiments, the length L1' can be, for example, around 300 nm. The length L1' may influence the frequency characteristics of the semiconductor structure 500. A shorter length L1' may enable the semiconductor structure 500 to work or operate in a higher frequency.

Figure 6:
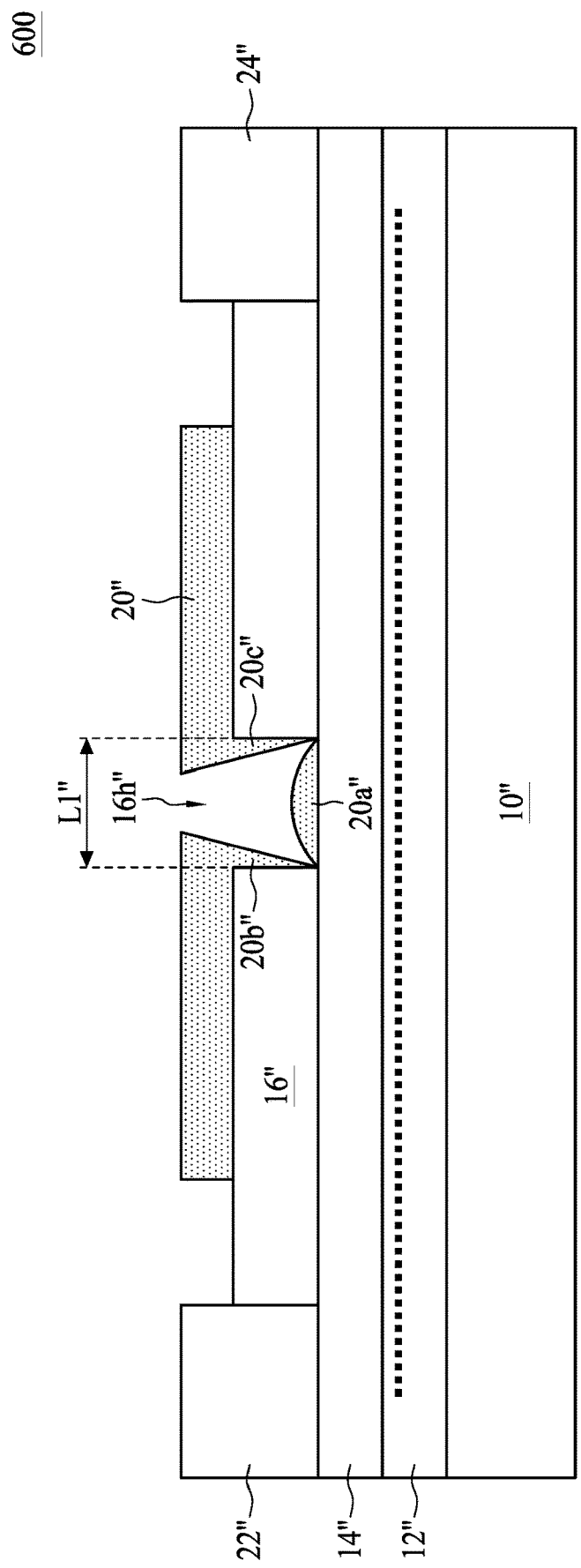
FIG. 6 is a simplified schematic cross-sectional view of a portion of a semiconductor structure according to certain comparative embodiments of the present disclosure.

FIG. 6 is a simplified schematic cross-sectional view of a portion of a semiconductor structure according to certain comparative embodiments of the present disclosure.

FIG. 6 shows a semiconductor structure 600 according to certain comparative embodiments of the present disclosure. The semiconductor structure 600 can also be referred to as a semiconductor device or a semiconductor apparatus.

As shown in FIG. 6, the semiconductor structure 600 includes a substrate 10", a channel layer 12", a barrier layer 14", a dielectric layer 16", a gate 20", a drain 22" and a source 24".

The dielectric layer 16" includes a recess 16h" and a portion of the gate 20" is disposed within the recess 16h". The recess 16h" has a length L1". In some embodiments, the length L1" can be smaller than 200 nm. In some embodiments, the length L1' can be, for example, around 150 nm.

The length L1" may influence the frequency characteristics of the semiconductor structure 600. A shorter length L1" may enable the semiconductor structure 600 to work or operate in a higher frequency.

Nevertheless, due to the process or material limitations, the cost of forming a recess 16h" having a length L1" smaller than a specific length increases. Also, due to the process or material limitations, disposing the gate 20" within a recess 16h" having a length L1" smaller than a specific length may induce some issues.

In some embodiments, the cost of forming a recess 16h" having a length L1" smaller than 200 nm increases significantly. In some embodiments, the difficulty of forming the gate 20" within the recess 16h" increases if the length L1" is smaller than 200 nm.

Referring to FIG. 6, the gate 20" includes portions 20a", 20b" and 20c". The portion 20a" may be separated from the portion 20b". The portion 20a" may not be electrically connected to the portion 20b". The portion 20a" may be separated from the portion 20c". The portion 20a" may not be electrically connected to the portion 20c". The gate 20" may not function appropriately due to the separation between the portion 20a" and the portion 20b". The gate 20" may not function appropriately due to the separation between the portion 20a" and the portion 20c". As a result, the semiconductor structure 600 may not function appropriately.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately," "substantially," "substantial" and "about" are used to describe and account for small variations. When used in conjunction with an event or circumstance, the terms can refer to instances in which the event of circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints, unless specified otherwise. The term "substantially coplanar" can refer to two surfaces within micrometers (μm) of lying along a same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device, comprising: a substrate; a barrier layer disposed above the substrate; a dielectric layer disposed on the barrier layer and defining a first recess; a spacer disposed within the first recess; a gate disposed between a first portion of the spacer and a second portion of the spacer, wherein the gate defines a gate recess; and a first protection layer, wherein the first protection layer comprises a first portion disposed between the first portion of the spacer and the dielectric layer, and the first protection layer comprises a second portion disposed between the first portion of the spacer and the barrier layer, wherein the first protection layer comprises at least one material different from that of the spacer, wherein the first protection layer comprises a curved surface between the first portion of the spacer and the dielectric layer and wherein the curved surface of the first protection layer directly connects the dielectric layer to the first portion of the spacer to form a connection interface.

2. The semiconductor device according to claim 1, wherein the gate is in direct contact with the barrier layer.

3. The semiconductor device according to claim 1, wherein the first portion of the spacer comprises a surface laterally connecting the dielectric layer to the barrier layer from a cross sectional view perspective.

4. The semiconductor device according to claim 1, wherein the second portion of the spacer comprises a surface laterally connecting the dielectric layer to the barrier layer from a cross sectional view perspective.

5. The semiconductor device according to claim 1, wherein the gate recess is defined by a first curved surface and a second curved surface of the gate.

6. The semiconductor device according to claim 1, wherein the first portion of the spacer and the second portion of the spacer define a tapered recess from a cross sectional view perspective.

7. The semiconductor device according to claim 6, wherein the dimension of the tapered recess decreases gradually in a direction toward the barrier layer.

8. The semiconductor device according to claim 6, wherein a first portion of the gate within the tapered recess comprises a first length, a second portion of the gate within the tapered recess comprises a second length, and the first length is larger than the second length.

9. The semiconductor device according to claim 1, wherein the barrier layer comprises a second recess between the first portion of the spacer and the second portion of the spacer.

10. The semiconductor device according to claim 9, wherein a bottom surface of the second recess is lower than an interface between the first portion of the spacer and the barrier layer.

11. The semiconductor device according to claim 1, wherein the first portion of the spacer comprises a relative rough surface.

12. The semiconductor device according to claim 1, wherein the dielectric layer comprises a relatively smooth surface adjacent to the first portion of the spacer.

13. The semiconductor device according to claim 11, wherein the barrier layer comprises a relative smooth surface between the first portion of the spacer and the second portion of the spacer.

14. A semiconductor structure, comprising: a substrate; a barrier layer disposed above the substrate; a dielectric layer disposed on the barrier layer and defining a first recess; a gate disposed within the first recess, wherein a first portion of the gate is laterally spaced apart from the dielectric layer; a spacer disposed within the first recess; and a protection layer, wherein the protection layer comprises a first portion disposed between the spacer and the dielectric layer, the protection layer comprises a second portion disposed between the spacer and the barrier layer, wherein the protection layer comprises at least one material different from that of the spacer, wherein the protection layer comprises a curved surface between the spacer and the dielectric layer and wherein the curved surface of the protection layer directly connects the dielectric layer to the spacer to form a connection interface.

15. The semiconductor structure according to claim 14, wherein the first portion of the gate is spaced apart from the barrier layer.

16. The semiconductor structure according to claim 14, wherein the gate comprises a recess, and the dimension of the recess decreases gradually in a direction toward the barrier layer.

17. The semiconductor structure according to claim 14, wherein the gate comprises a recess defined by a first convex surface and a second convex surface.

18. The semiconductor structure according to claim 14, wherein the first portion of the gate is spaced apart from the dielectric layer by the spacer.

19. The semiconductor structure according to claim 18, wherein the spacer comprising a curved surface laterally connecting the dielectric layer to the barrier layer from a cross sectional view perspective.

20. A method for fabricating a semiconductor device, comprising: providing a semiconductor structure having a substrate, a barrier layer and a first dielectric layer; forming a first opening having a first length on the first dielectric layer; forming a protection layer within the first opening; forming a second dielectric layer on the first dielectric layer; removing a portion of the second dielectric layer, so as to form a first spacer and a second spacer within the first opening, wherein the smallest distance between the first spacer and the second spacer is smaller than the first length, the protection layer comprises at least one material different from that of the spacer; and removing a portion of the protection layer to expose a surface of the barrier layer, wherein the protection layer has a curved surface between the first spacer and the first dielectric layer by removing the portion of the protection layer and wherein the curved surface of the protection layer directly connects the first dielectric layer to the first spacer to form a connection interface.

21. The method according to claim 20, wherein the distance between the first spacer and the second spacer decreases in a direction toward the barrier layer.

22. The method according to claim 20, wherein the first spacer comprises a first surface adjacent to the dielectric layer and the barrier layer, and the second spacer comprises a second surface adjacent to the dielectric layer and the barrier layer.

23. The method according to claim 20, further comprising forming a gate covering the first spacer and the second spacer, wherein the gate comprises a recess defined by a first curved surface and a second curved surface.

24. The semiconductor device according to claim 1, wherein the curved surface of the first protection layer extends upward, and the connection interface is in a position higher than the dielectric layer.

25. The semiconductor device according to claim 1, wherein the curved surface of the first protection layer extends downward, and the connection interface is in a position lower than the dielectric layer.

* * * * *